(12) United States Patent
Lee et al.

(10) Patent No.: US 10,263,084 B2
(45) Date of Patent: Apr. 16, 2019

(54) SEMICONDUCTOR DEVICE HAVING BURIED GATE STRUCTURE AND METHOD OF FABRICATING THE SAME

(71) Applicant: Samsung Electronics Co., Ltd., Suwon-si (KR)

(72) Inventors: Dongjin Lee, Seoul (KR); Junsoo Kim, Anyang-si (KR); Moonyoung Jeong, Suwon-si (KR); Satoru Yamada, Seoul (KR); Dongsoo Woo, Seoul (KR); Jiyoung Kim, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/868,620

(22) Filed: Jan. 11, 2018

(65) Prior Publication Data

US 2018/0158918 A1    Jun. 7, 2018

Related U.S. Application Data

(63) Continuation of application No. 15/011,820, filed on Feb. 1, 2016, now Pat. No. 9,905,659.

(30) Foreign Application Priority Data

Feb. 12, 2015    (KR) .......................... 10-2015-0021726

(51) Int. Cl.
*H01L 29/40*    (2006.01)
*H01L 29/423*    (2006.01)
(Continued)

(52) U.S. Cl.
CPC ...... *H01L 29/402* (2013.01); *H01L 27/10876* (2013.01); *H01L 29/42392* (2013.01); *H01L 27/088* (2013.01)

(58) Field of Classification Search
CPC ......... H01L 29/42384; H01L 29/66545; H01L 29/78696; H01L 27/10876; H01L 29/42356; H01L 29/4236
(Continued)

(56) References Cited

U.S. PATENT DOCUMENTS 7,309,635 B2 *  12/2007  Park ................ H01L 21/823412
                                                            257/E21.051
7,368,348 B2    5/2008   Lee
(Continued)

FOREIGN PATENT DOCUMENTS

KR    10-2006-0054667 A    5/2006
KR    10-2011-0023002 A    3/2011
(Continued)

*Primary Examiner* — Jonathan Han
(74) *Attorney, Agent, or Firm* — Muir Patent Law, PLLC

(57) ABSTRACT

A semiconductor device may include a device isolation region configured to define an active region in a substrate, an active gate structure disposed in the active region, and a field gate structure disposed in the device isolation region. The field gate structure may include a gate conductive layer. The active gate structure may include an upper active gate structure including a gate conductive layer and a lower active gate structure formed under the upper active gate structure and vertically spaced apart from the upper active gate structure. The lower active gate structure may include a gate conductive layer. A top surface of the gate conductive layer of the field gate structure is located at a lower level than a bottom surface of the gate conductive layer of the upper active gate structure.

19 Claims, 31 Drawing Sheets

(51) Int. Cl.
*H01L 27/108* (2006.01)
*H01L 27/088* (2006.01)

(58) Field of Classification Search
USPC .............. 257/E21.444, E29.137, E29.275,
257/E21.209; 438/283, 284
See application file for complete search history.

(56) References Cited

U.S. PATENT DOCUMENTS

| | | | |
|---|---|---|---|
| 8,263,460 B2 * | 9/2012 | Kim | H01L 21/823437 |
| | | | 257/E21.41 |
| 8,298,875 B1 | 10/2012 | Or-Bach et al. | |
| 8,357,578 B2 * | 1/2013 | Kim | H01L 21/324 |
| | | | 257/392 |
| 8,610,203 B2 | 12/2013 | Kim | |
| 8,853,018 B2 | 10/2014 | Baek | |
| 2006/0105529 A1 * | 5/2006 | Lee | H01L 29/42384 |
| | | | 438/283 |
| 2013/0309825 A1 * | 11/2013 | Baek | H01L 29/66484 |
| | | | 438/259 |
| 2013/0323911 A1 | 12/2013 | Cho | |
| 2014/0064006 A1 | 3/2014 | Min | |

FOREIGN PATENT DOCUMENTS

| | | |
|---|---|---|
| KR | 10-2011-0112613 A | 10/2011 |
| KR | 10-2013-0127206 A | 11/2013 |
| KR | 10-2013-0128503 A | 11/2013 |

\* cited by examiner

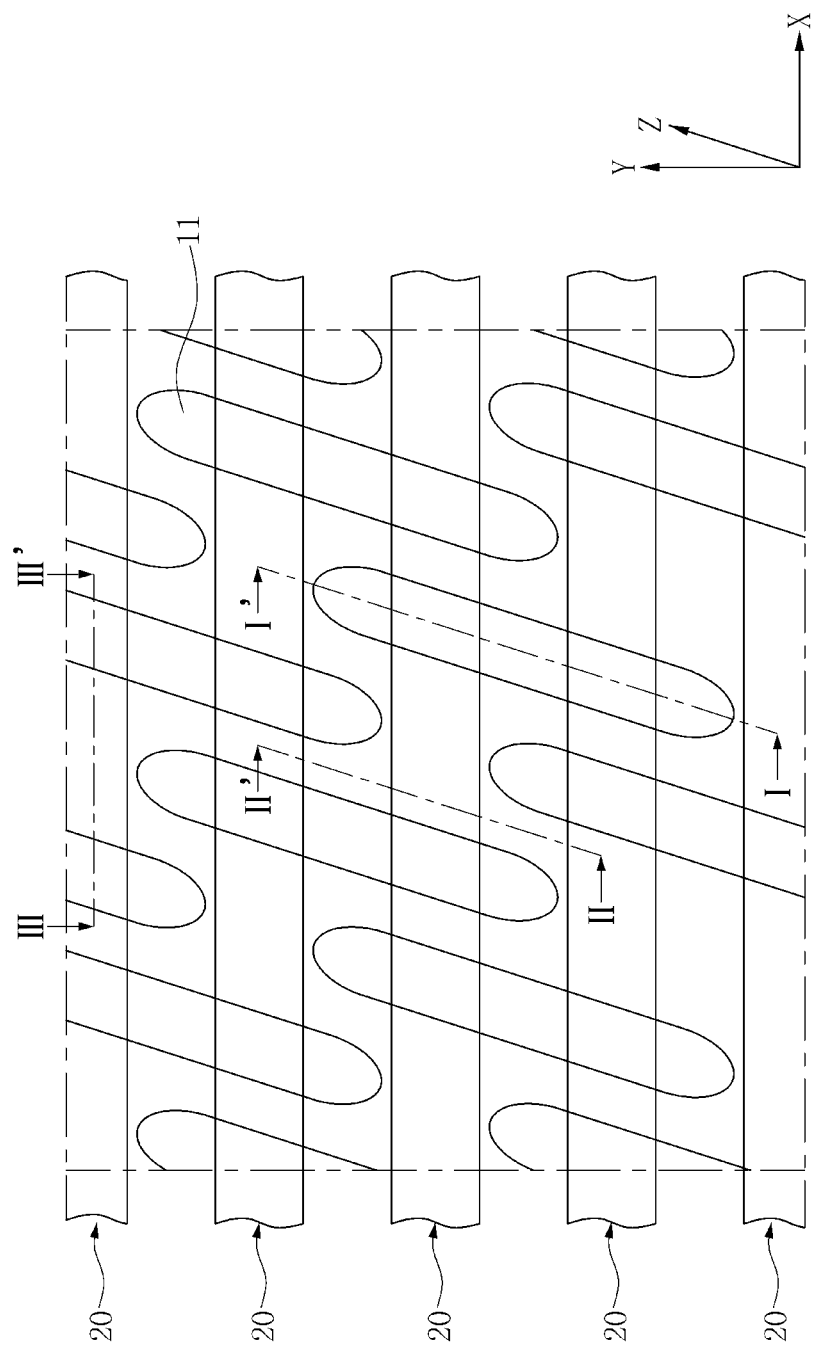

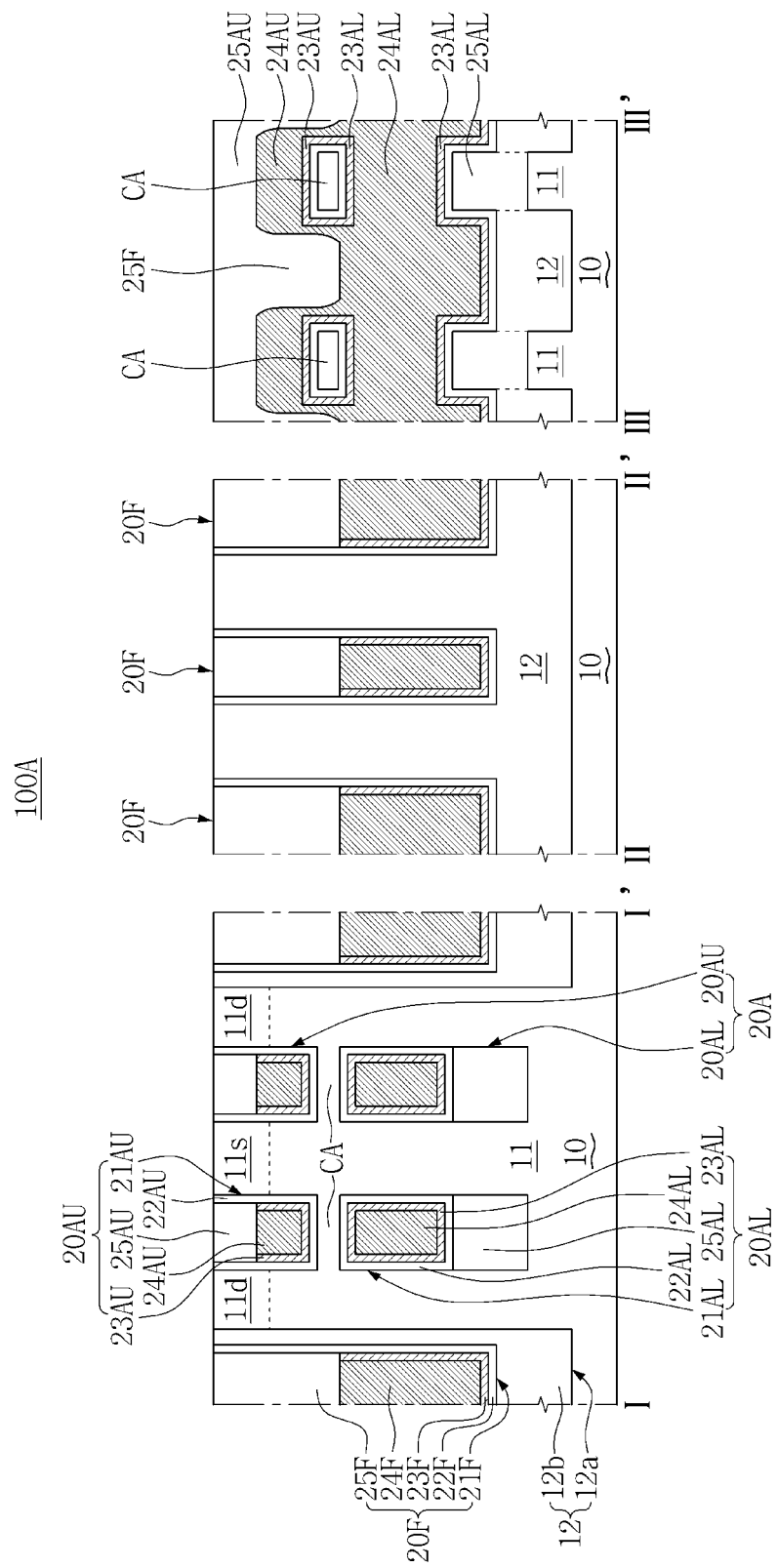

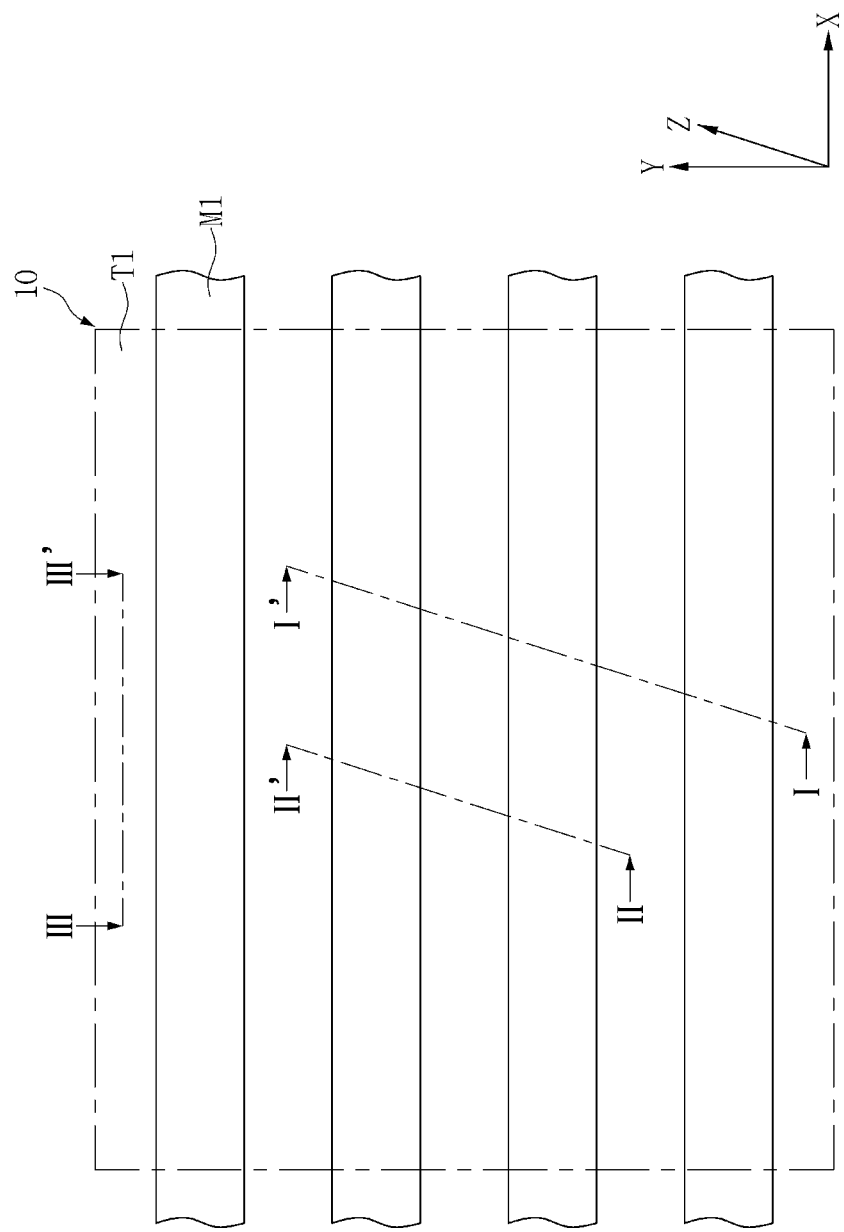

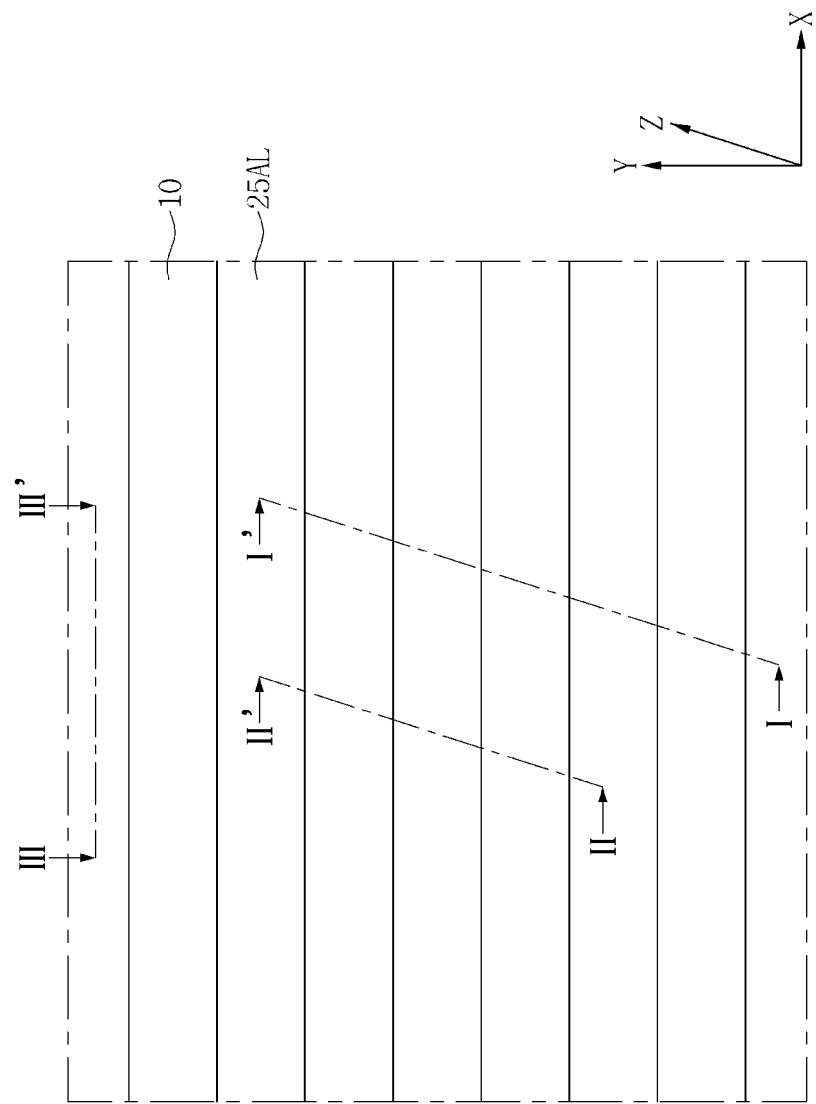

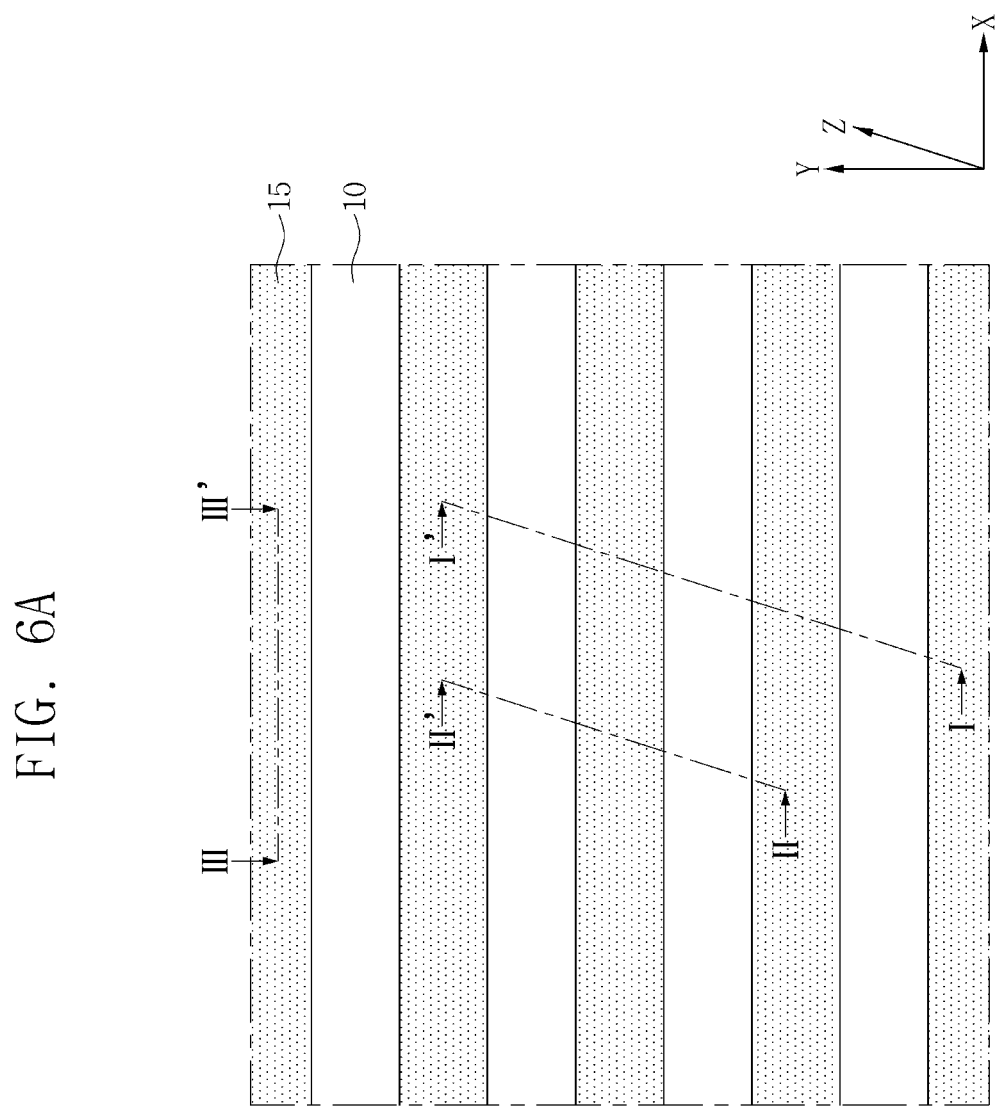

SEMICONDUCTOR DEVICE HAVING BURIED GATE STRUCTURE AND METHOD OF FABRICATING THE SAME

CROSS-REFERENCE TO RELATED APPLICATION

The present application is a Continuation of U.S. patent application Ser. No. 15/011,820, filed on Feb. 1, 2016, now allowed, which claims priority under 35 U.S.C. § 119 to Korean Patent Application No. 10-2015-0021726 filed on Feb. 12, 2015, the entire disclosure of each of which is incorporated by reference herein.

BACKGROUND

The present disclosure relates to a semiconductor device having a buried gate structure and a method of fabricating the same.

Semiconductor devices are widely used in the electronics industry because of their small sizes, multifunctionality, and low manufacturing cost. However, since semiconductor devices have become highly integrated with the development of the electronics industry, various problems have been generated. For example, intervals between cell transistors formed in the same active region have been reduced, and thus electrons moving along a channel of a cell transistor in an on state can move to a channel of adjacent cell transistor in an off state. As a result, data stored in a capacitor connected with the cell transistor in the off state can be lost.

SUMMARY

Example embodiments of the inventive concept may provide semiconductor devices that may mitigate inter-cell interference in the same active region and methods of fabricating the semiconductor devices.

Other example embodiments of the inventive concept may provide electronic devices including the semiconductor device.

In accordance with certain aspects of the inventive concept, a semiconductor device includes a device isolation region defining an active region in a substrate, an active gate structure in the active region, and a field gate structure in the device isolation region. The field gate structure may include a gate conductive layer. The active gate structure may include an upper active gate structure including a gate conductive layer and a lower active gate structure formed under the upper active gate structure and vertically spaced apart from the upper active gate structure. The lower active gate structure may include a gate conductive layer. A channel area may be formed between the upper active gate structure and the lower active gate structure. A volume of the gate conductive layer of the upper active gate structure may be smaller than a volume of the gate conductive layer of the lower active gate structure. A top surface of the gate conductive layer of the field gate structure may be located at a lower level than a bottom surface of the gate conductive layer of the upper active gate structure.

In accordance with certain aspects of the inventive concept, a semiconductor device includes a device isolation region configured to define an active region in a substrate, a lower gate structure disposed in the active region, an upper active gate structure vertically spaced apart from the active gate insulating structure on the active gate insulating structure, and a field gate structure disposed in the device isolation region. The upper active gate structure may include a gate conductive layer. Also, the field gate structure may include a gate conductive layer. A top surface of the gate conductive layer of the field gate structure may be substantially coplanar with a top surface of the lower active gate structure.

In accordance with certain aspects of the inventive concept, a semiconductor device includes a device isolation region configured to define an active region in a substrate, an active gate structure disposed in the active region, and a field gate structure disposed in the device isolation region. The field gate structure may include a filed gate insulating layer and a filed gate conductive layer on the filed gate insulating layer. The active gate structure may include a first gate structure including a blocking insulation layer, a first gate insulating layer on the blocking insulation layer, and a first gate conductive layer on the first gate insulating layer, a second gate structure formed on the first gate structure and vertically spaced apart from the first gate structure. The second gate structure may include a second gate insulating layer and a second gate conductive layer on the second gate insulating layer. A bottom surface of the blocking insulation layer of the first gate structure is lower than a bottom surface of the field gate conductive layer of the field gate structure.

BRIEF DESCRIPTION OF THE DRAWINGS

Exemplary embodiments of the present disclosure will be more clearly understood from the following detailed description taken in conjunction with the attached drawings in which:

FIG. 1 is layout schematically showing a semiconductor device according to example embodiments;

FIGS. 2A to 2D are cross-sectional views taken along lines I-I', II-II' and III-III' of FIG. 1 for describing semiconductor devices according to example embodiments;

FIGS. 3A, 3B, 4A, 4B . . . 9A, 9B, 10, and 11 to 19 are views illustrating methods of fabricating semiconductor devices according to example embodiments;

DETAILED DESCRIPTION

Figure 2B:
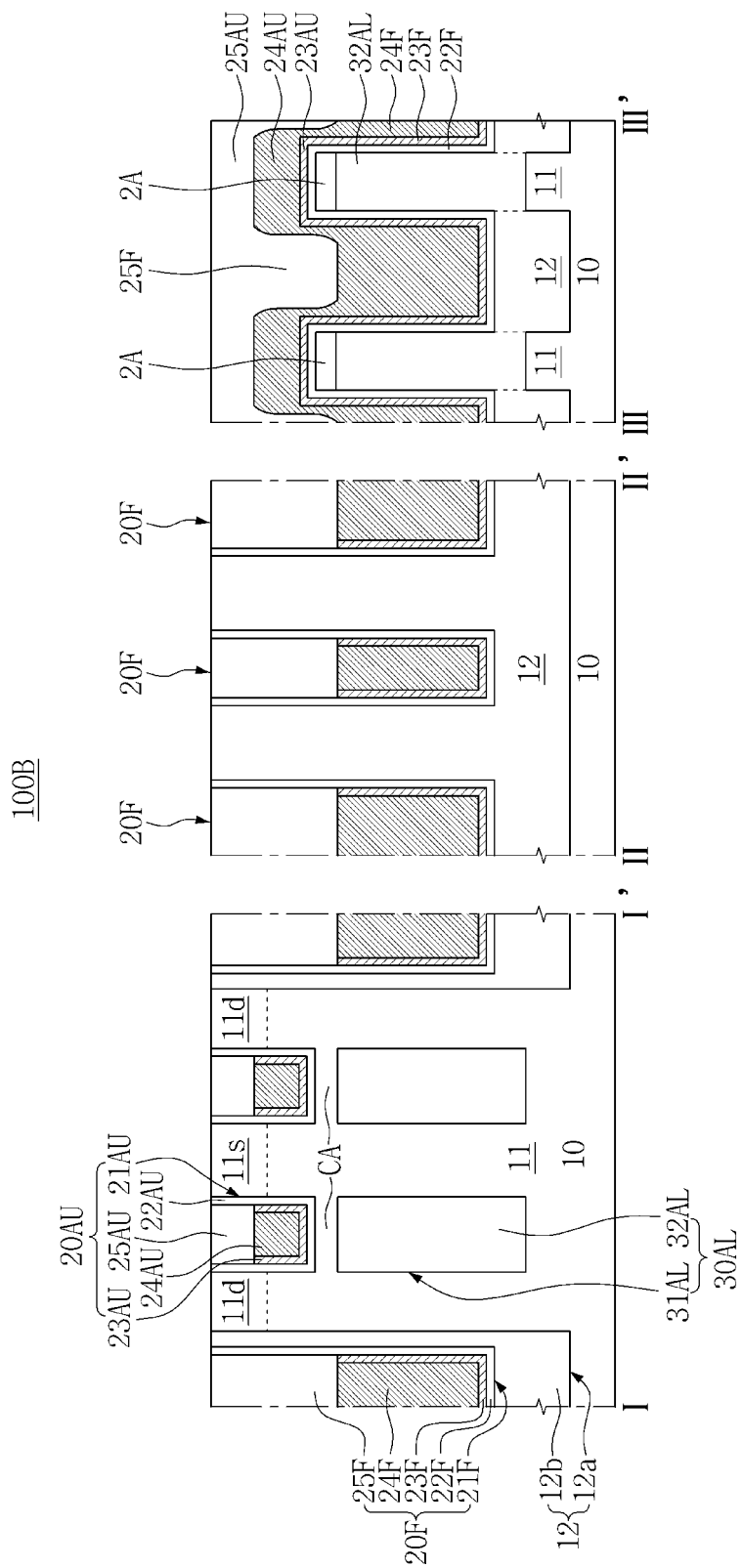

Various exemplary embodiments will now be described more fully with reference to the accompanying drawings. The various aspects of the inventive concepts disclosed herein may, however, be embodied in different forms and should not be construed as limited to the exemplary embodiments set forth herein. Known processes, elements, and techniques are not described with respect to some of the embodiments of the disclosure.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular form may number one or more, unless the context clearly indicates otherwise. Expressions such as "at least one of," when preceding a list of elements, modify the entire list of elements and do not modify the individual elements of the list. It will be further understood that the terms "comprises,"

"comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. The term "contact," as used herein, refers to a direct contact, unless indicated otherwise.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Unless the context indicates otherwise, terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Embodiments are described herein with reference to cross-sectional and/or planar illustrations that are schematic illustrations of idealized exemplary embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is layout schematically illustrating semiconductor devices according to example embodiments.

Referring to FIG. 1, semiconductor devices according to example embodiments may include gate lines 20 extending in an X-direction, and bar-shaped active regions 11 extending in a Z-direction diagonal to the X-direction. The active regions 11 may be disposed to be staggered in the X-direction as shown in FIG. 1.

As used herein, a semiconductor device may refer to any of the various devices such as shown in FIGS. 2A to 2D, and may also refer, for example, to a transistor or a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory module, a hard drive including additional components, a mobile phone, laptop, tablet, desktop, camera, server, computing system, or other consumer electronics device, etc.

FIG. 2A shows cross-sectional views taken along lines I-I', II-II' and III-III' of FIG. 1 for describing a semiconductor device 100A according to example embodiments.

Referring to FIGS. 1 and 2A, a semiconductor device 100A according to example embodiments of the inventive concept may include device isolation regions 12 defining active regions 11 in a substrate 10, and gate structures 20. The gate structures 20 may include active gate structures 20A and field gate structures 20F. The active gate structures 20A may be formed in the active regions 11. The field gate structures 20F may be formed in the device isolation regions 12. The active gate structures 20A may include upper active gate structures 20AU and lower active gate structures 20AL.

The device isolation regions 12 may include device isolation trenches 12a formed in the substrate 10, and a device isolation insulating material 12b filling the device isolation trenches 12a. The device isolation insulating material 12b may include, for example, silicon oxide.

The active regions 11 may include a source area 11s between the active gate structures 20A and drain areas 11d between the active gate structures 20A and the device isolation regions 12. The source area 11s and the drain areas 11d may include, for example, N-type impurities such as phosphorus (P) and/or arsenic (As).

Each of the upper active gate structures 20AU may include an upper active gate insulating layer 22AU, an upper active gate barrier pattern 23AU, an upper active gate electrode pattern 24AU and upper active gate capping insulating pattern 25AU in an upper active gate trench 21AU.

The upper active gate trench 21AU may be formed from a surface of the substrate 10 toward the inside of the substrate 10 in the active regions 11.

The upper active gate insulating layer 22AU may be conformally formed on an entire inner wall of the upper active gate trench 21AU. The upper active gate insulating layer 22AU may include, for example, silicon oxide, silicon nitride, silicon oxynitride, or a metal oxide. The metal oxide may include, for example, hafnium oxide, aluminum oxide, or titanium oxide.

The upper active gate barrier pattern 23AU may be conformally formed on the upper active gate insulating layer 22AU. The upper active gate barrier pattern 23AU may be formed in part of the upper active gate trench 21AU. For example, the upper active gate barrier pattern 23AU may be formed in a lower portion of the upper active gate trench 21AU. The upper active gate barrier pattern 23AU may include a barrier metal compound such as titanium nitride (TiN) or tantalum nitride (TaN).

The upper active gate electrode pattern 24AU may be formed on the upper active gate barrier pattern 23AU to partially fill the upper active gate trench 21AU. For example, the upper active gate electrode pattern 24AU may fill the lower portion of the upper active gate trench 21AU. A top surface of the upper active gate electrode pattern 24AU and a top surface of the upper active gate barrier pattern 23AU may be coplanar. The upper active gate electrode pattern 24AU may include a metal such as tungsten or copper.

The upper active gate capping insulating pattern 25AU may be formed on the upper active gate insulating layer 22AU, the upper active gate barrier pattern 23AU and the upper active gate electrode pattern 24AU to fill the upper active gate trench 21AU. The upper active gate capping insulating pattern 25AU may include, for example, silicon nitride.

Each of the lower active gate structures 20AL may include a lower active gate tunnel 21AL, a lower active gate insulating layer 22AL, a lower active gate barrier pattern 23AL, a lower active gate electrode pattern 24AL, and a lower active gate blocking pattern 25AL.

The lower active gate tunnel 21AL may be formed in the substrate 10 to be vertically aligned with the upper active gate trench 21AU. The lower active gate tunnel 21AL may extend in an X direction. The lower active gate tunnel 21AL may be vertically spaced apart from the upper active gate trench 21AU. Accordingly, channel areas CA between top surfaces of the lower active gate structures 20AL and bottom surfaces of the upper active gate structures 20AU may be formed. The channel areas CA may be connected to the active regions 11 located at both sides of the active gate structures 20A. A width of the lower active gate tunnel 21AL may be substantially the same as a width of the upper active gate trench 21AU. In another embodiment, the width of the lower active gate tunnel 21AL may be wider than the width of the upper active gate trench 21AU.

The lower active gate insulating layer 22AL may be conformally formed on an entire inner wall of the lower active gate tunnel 21AL. The lower active gate insulating layer 22AL may include, for example, silicon oxide, silicon nitride, silicon oxynitride, or a metal oxide. The metal oxide may include hafnium oxide, aluminum oxide, or titanium oxide.

The lower active gate barrier pattern 23AL may be conformally formed on the lower active gate insulating layer 22AL. The lower active gate barrier pattern 23AL may include a barrier metal compound such as titanium nitride (TiN) or tantalum nitride (TaN).

The lower active gate electrode pattern 24AL may be formed on the lower active gate barrier pattern 23AL to fully fill the lower active gate tunnel 21AL. The lower active gate electrode pattern 24AL may include a metal such as tungsten or copper.

The lower active gate electrode pattern 24AL and the lower active gate barrier pattern 23AL may have volumes different from volumes of the upper active gate electrode pattern 24AU and the upper active gate barrier pattern 23AU, respectively. For example, the volumes of the lower active gate electrode pattern 24AL and the lower active gate barrier pattern 23AL are greater than the volumes of the upper active gate electrode pattern 24AU and the upper active gate barrier pattern 23AU, respectively. For example, vertical lengths (e.g., thicknesses) of the lower active gate electrode pattern 24AL and the lower active gate barrier pattern 23AL are greater than vertical lengths of the upper active gate electrode pattern 24AU and the upper active gate barrier pattern 23AU, respectively. In example embodiments, a thickness of the lower active gate electrode pattern 24AL may be greater than a thickness of the upper active gate electrode pattern 24AU. In example embodiments, horizontal widths of the lower active gate electrode pattern 24AL and the lower active gate barrier pattern 23AL are greater than horizontal widths of the upper active gate electrode pattern 24AU and the upper active gate barrier pattern 23AU.

The lower active gate blocking pattern 25AL may be formed beneath the lower active gate tunnel 21AL. For example, the lower active gate tunnel 21AL may be disposed on the lower active gate blocking pattern 25AL. A width of the lower active gate blocking pattern 25AL is substantially the same as a width of the lower active gate tunnel 21AL. The lower active gate blocking pattern 25AL may include, for example, silicon oxide. When the lower active gate insulating layer 22AL includes the silicon oxide, a boundary between the lower active gate insulating layer 22AL and the lower active gate blocking pattern 25AL may disappear. The lower active gate blocking pattern 25AL may be relatively thicker than the upper active gate insulating layer 22AU and the lower active gate insulating layer 22AL.

The field gate structures 20F may include a field gate insulating layer 22F, a field gate barrier pattern 23F, a field gate electrode pattern 24F, and field gate capping insulating pattern 25F which are formed in a field gate trench 21F.

The field gate trench 21F may be formed from a surface of the substrate 10 toward the inside of the substrate 10 in the device isolation region 12. A bottom surface of the field gate trench 21F may be located at a lower level than a bottom surface of the upper active gate trench 21AU of the upper active gate structure 20AU and a bottom surface of the lower active gate tunnel 21AL of the lower active gate structure 20AL. The bottom surface of the field gate trench 21F may be located at a higher level than a bottom surface of the lower active gate blocking pattern 25AL of the lower active gate structure 20AL. The field gate insulating layer 22F may be conformally formed on an entire inner wall of the field gate trench 21F. The field gate insulating layer 22F may include, for example, silicon oxide, silicon nitride, silicon oxynitride, or a metal oxide. The metal oxide may include hafnium oxide, aluminum oxide, or titanium oxide.

The field gate barrier pattern 23F may be conformally formed on the field gate insulating layer 22F. The field gate barrier pattern 23F may be formed in part of the field gate trench 21F. For example, the field gate barrier pattern 23F may be formed on a lower portion of the field gate trench 21F. The field gate barrier pattern 23F may include a barrier metal compound such as titanium nitride (TiN) or tantalum nitride (TaN).

The field gate electrode pattern 24F may be formed on the field gate barrier pattern 23F to partially fill the field gate trench 21F. For example, the field gate electrode pattern 24F may fill the lower portion of the field gate trench 21F. A top surface of the field gate electrode pattern 24F and a top surface of the field gate barrier pattern 23F may be substantially coplanar. The field gate electrode pattern 24F may include a metal such as tungsten or copper. In example embodiments, a bottom surface of the field gate electrode pattern 24F may be located at a higher level than a bottom surface of the lower active gate blocking pattern 25AL.

In example embodiments, the top surfaces of the field gate electrode pattern 24F and the field gate barrier pattern 23F may be located at a lower level than a bottom surface of the upper active gate structure 20AU. For example, the top surfaces of the field gate electrode pattern 24F and the field gate barrier pattern 23F may be located at a lower level than the bottom surface of the upper active gate trench 21AU of the upper active gate structure 20AU. For example, the top surface of the field gate electrode pattern 24F may be located at a lower level than the bottom surface of the upper active gate electrode pattern 24AU of the upper active gate structure 20AU. Also, the top surfaces of the field gate electrode pattern 24F and the field gate barrier pattern 23F may have levels equal to or higher than a top surface of the lower active gate structure 20AL. For example, the top surfaces of the field gate electrode pattern 24F and the field gate barrier pattern 23F may overlap or not overlap the channel areas CA between the upper active gate structures 20AU and the lower active gate structures 20AL in a horizontal direction.

The field gate capping insulating pattern 25F may be formed on the field gate insulating layer 22F, the field gate barrier pattern 23F and the field gate electrode pattern 24F to fill the field gate trench 21F. The field gate capping insulating pattern 25F may include silicon nitride.

According to example embodiments, the semiconductor device 100A may include an active gate structure 20A including an upper active gate structure 20AU and a lower active gate structure 20AL which are vertically spaced apart from each other. Accordingly, channels surrounded by the active gate structures may be formed. As a result, interference between cell transistors can be prevented by blocking electron movement from one channel to an adjacent channel.

In example embodiments, a top surface of the field gate electrode pattern 24F formed in a device isolation region 12 may be formed at a level lower than a bottom surface of an upper gate electrode pattern 24AU formed in an active region 11. Accordingly, the gate induced drain leakage (GIDL) can be improved by removing the passing gate effect.

In example embodiments, a vertical length (e.g., a thickness) of an upper active gate structure 20AU may be reduced. Accordingly, a channel length can be reduced, and thus a read/write speed can be improved by increasing a channel current.

In example embodiments, a lower active gate blocking pattern 25AL beneath a lower active gate structure 20AL may be formed. Accordingly, it can prevent electrons from moving to an adjacent cell transistor through a lower portion of the lower active gate structure 20AL.

FIG. 2B shows cross-sectional views taken along lines I-I', II-II' and III-III' of FIG. 1 for describing a semiconductor device 100B according to example embodiments. In the example embodiments, detailed descriptions of the same content as those of the above-described embodiments will be omitted.

Referring to FIGS. 1 and 2B, a semiconductor device 100B according to example embodiments may include lower active insulating structures 30AL beneath the upper active gate structures 20AU, compared to the semiconductor device 100A in FIG. 2A. The lower active insulating structures 30AL may be vertically spaced apart from the upper active gate structures 20AU.

The lower active insulating structures 30AL may include lower active insulating tunnels 31AL formed in the substrate 10, and a lower active insulating material 32AL filling the lower active insulating tunnels 31AL. The lower active insulating material 32AL may include, for example, silicon oxide. In example embodiments, channel areas CA formed in the active regions 11 may be surrounded by the upper active gate structures 20AU and the lower active insulating structures 30AL. Horizontal widths of the upper active gate structures 20AU may be substantially the same as horizontal widths of the lower active insulating structures 30AL. Vertical lengths of the upper active gate structures 20AU may be smaller than vertical lengths of the lower active insulating structures 30AL.

Figure 2C:
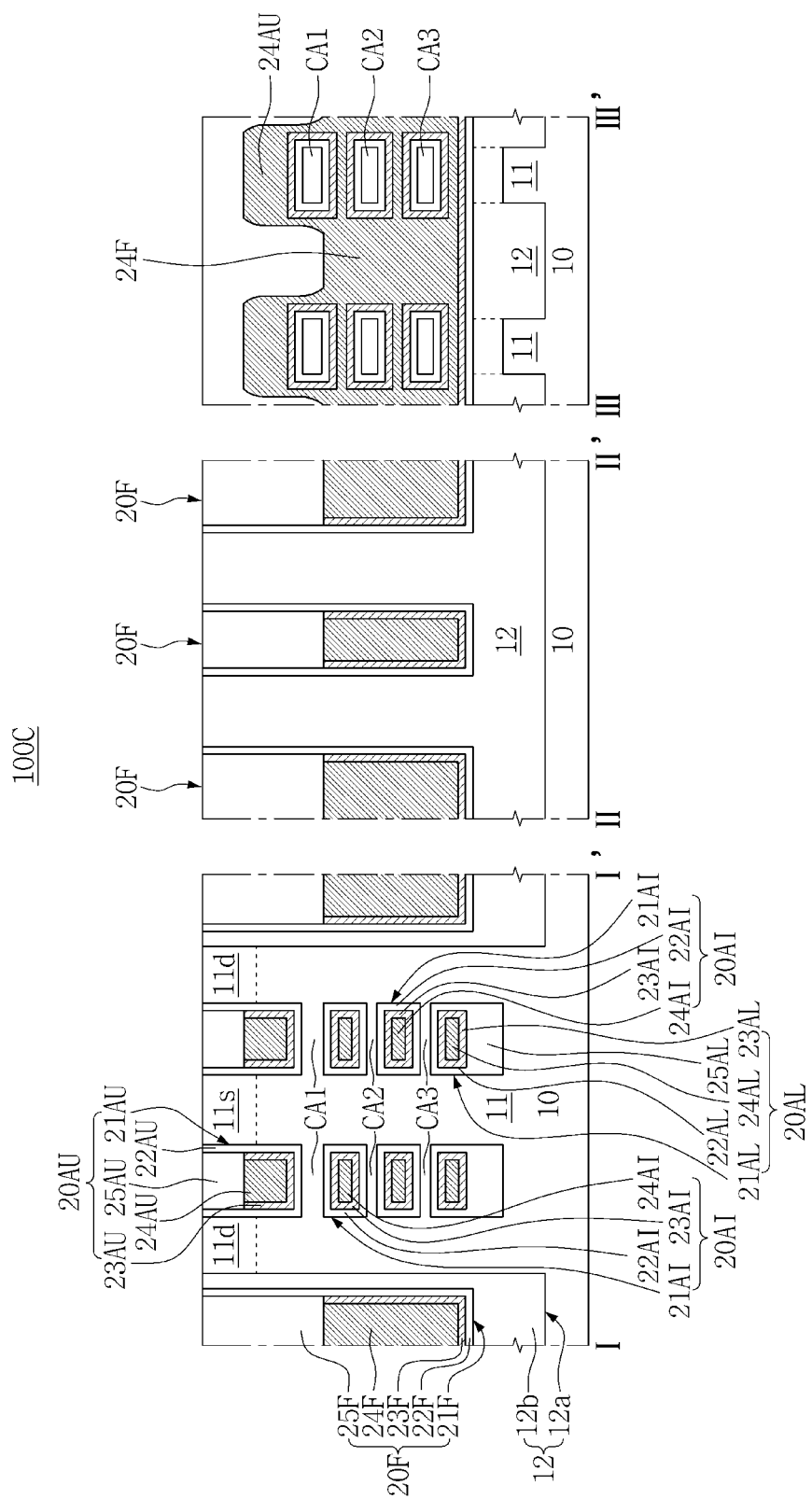

FIG. 2C shows cross-sectional views taken along lines I-I', II-II' and III-III' of FIG. 1 for describing a semiconductor device 100C according to example embodiments. In the example embodiments, detailed descriptions of the same content as those of the above-described embodiments will be omitted.

Referring to FIGS. 1 and 2C, a semiconductor device 100C according to example embodiments may include a plurality of intermediate active gate structures 20AI formed between upper active gate structures 20AU and lower active gate structures 20AL, compared to the semiconductor device 100A in FIG. 2A. The upper active gate structures 20AU, the intermediate active gate structures 20AI and the lower active gate structures 20AL may be vertically spaced apart from each other. For example, first channel areas CA1, second channel areas CA2, and third channel areas CA3 may be formed between the upper active gate structures 20AU and the intermediate active gate structures 20AI, between the intermediate active gate structures 20AI, and between the intermediate active gate structures 20AI and the lower active gate structures 20AL, respectively. For example, the semiconductor device 100C may include multi channel areas CA1, CA2, and CA3 in the active regions 11.

Each of the intermediate active gate structures 20AI may include an intermediate active gate tunnel 21AI, an intermediate active gate insulating layer 22AI conformally formed on inner walls of the intermediate active gate tunnel 21AI, an intermediate active gate barrier pattern 23AI conformally formed on the intermediate active gate insulating layer 22AI, and an intermediate active gate electrode pattern 24AI formed on the intermediate active gate barrier pattern 23AI to fill the intermediate active gate tunnel 21AI.

In example embodiments, a lower active gate structure 20AL may have a lower active gate blocking pattern 25AL including the same material as a lower active gate insulating layer 22AL. The lower active gate blocking pattern 25AL may be relatively thicker than the upper active gate insulating layer 22AU and also may be relatively thicker than the lower active gate insulating layer 22AL.

Figure 2D:
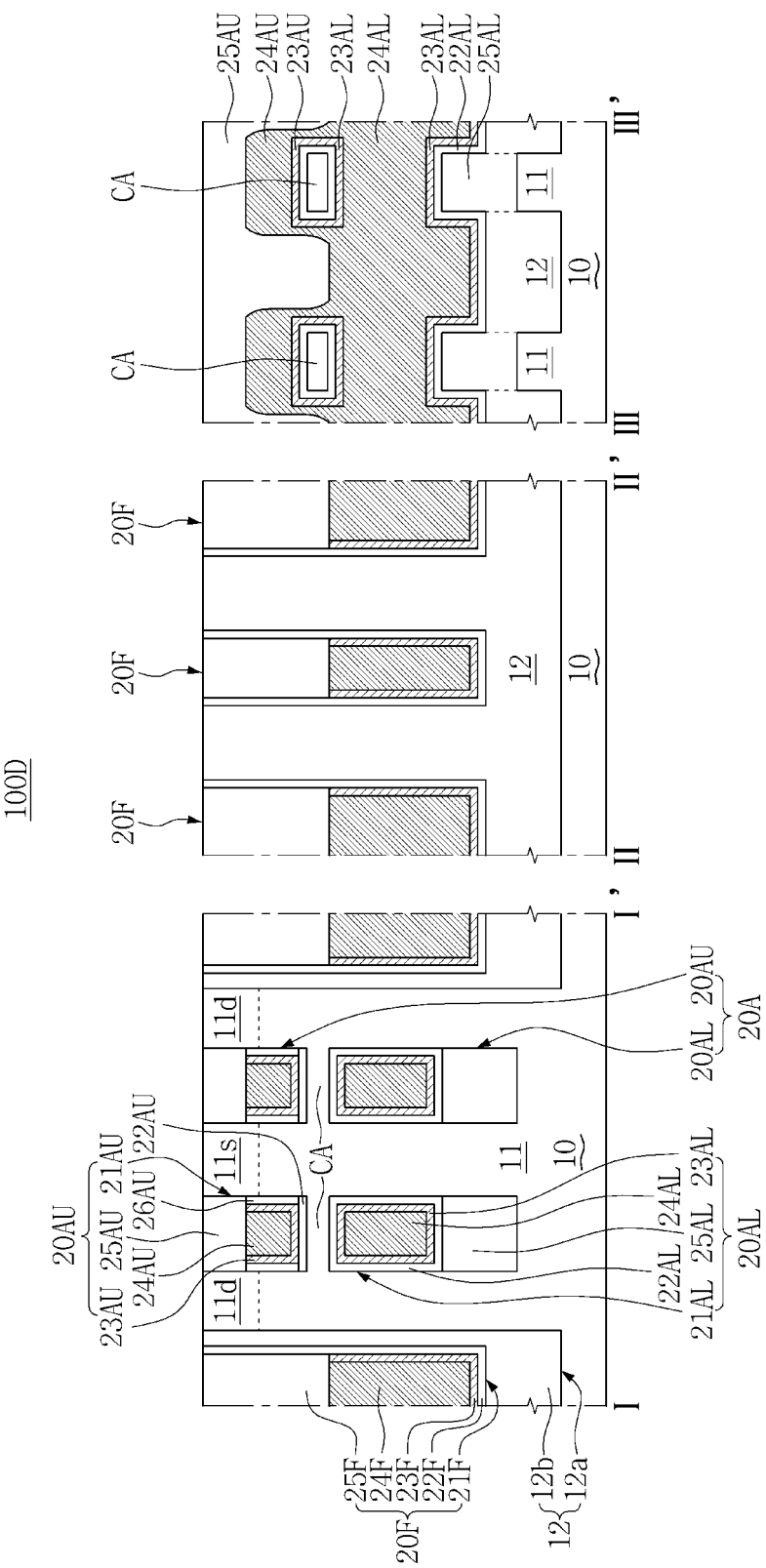

FIG. 2D shows cross-sectional views taken along lines I-I', II-II' and III-III' of FIG. 1 for describing a semiconductor device 100D according to example embodiments. In the example embodiments, detailed descriptions of the same content as those of the above-described embodiments will be omitted.

Referring to FIGS. 1 and 2D, each of upper active gate structures 20AU of a semiconductor device 100D according to example embodiments may include air gaps 26AU formed between inner sidewalls of an upper active gate trench 21AU and upper active gate barrier pattern 23AU and an upper active gate insulating layer 22AU formed between inner bottom surface of the upper active gate trench 21AU and the upper active gate barrier pattern 23AU, compared to the semiconductor device 100A in FIG. 2A.

FIGS. 3A, 3B, 4A, 4B . . . 9A, 9B, 10, 11 and 12 are plan views for describing a method of fabricating a semiconductor device 100A according to example embodiments and cross-sectional views taken along lines I-I', II-II' and III-III' of the above plan views.

Figure 3B:
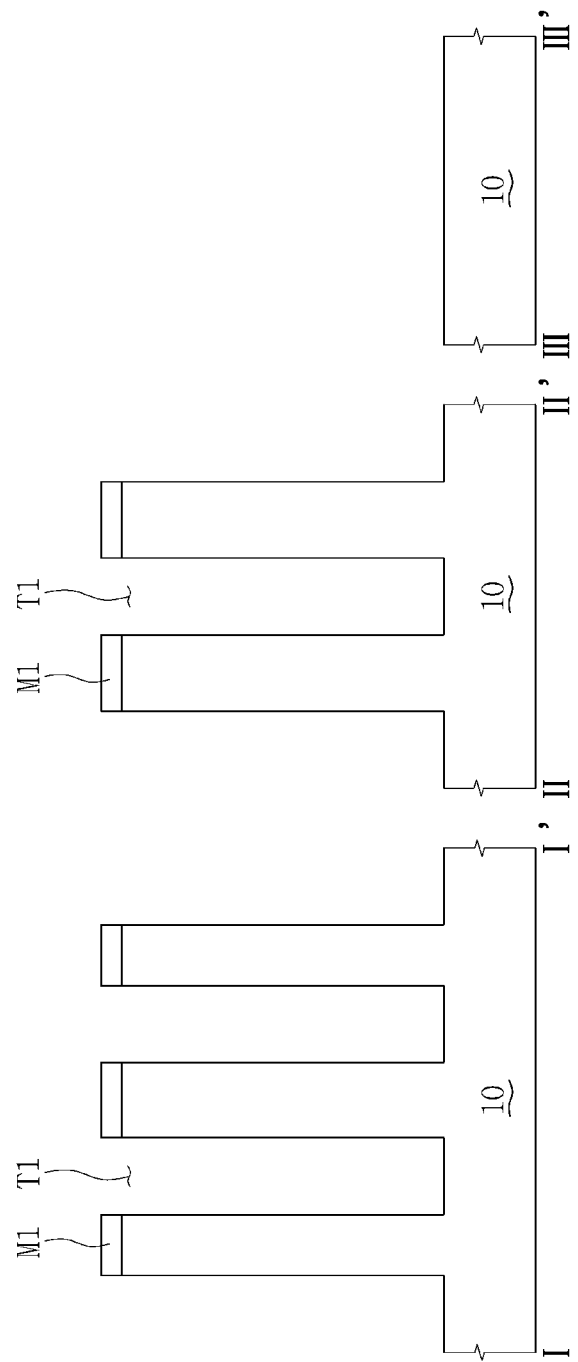

Referring to FIGS. 3A and 3B, the method of fabricating the semiconductor device 100A according to example embodiments may include forming first mask patterns M1 on a substrate 10, and forming first trenches T1 in the substrate 10 by performing an etching process using the first mask patterns M1 as an etching mask. Referring to FIG. 2A, the first trenches T1 may be trenches for forming lower active gate structures 20AL in active regions 11 of the substrate 10. Each of the first mask patterns M1 may be disposed spaced apart from and parallel to each other in a Y direction. Each of the first mask patterns M1 may extend in an X direction. Each of the first trenches T1 may be disposed spaced apart from and parallel to each other in the Y direction and extend in the X direction. The first mask patterns M1 may include, for example, silicon oxide.

Figure 4B:
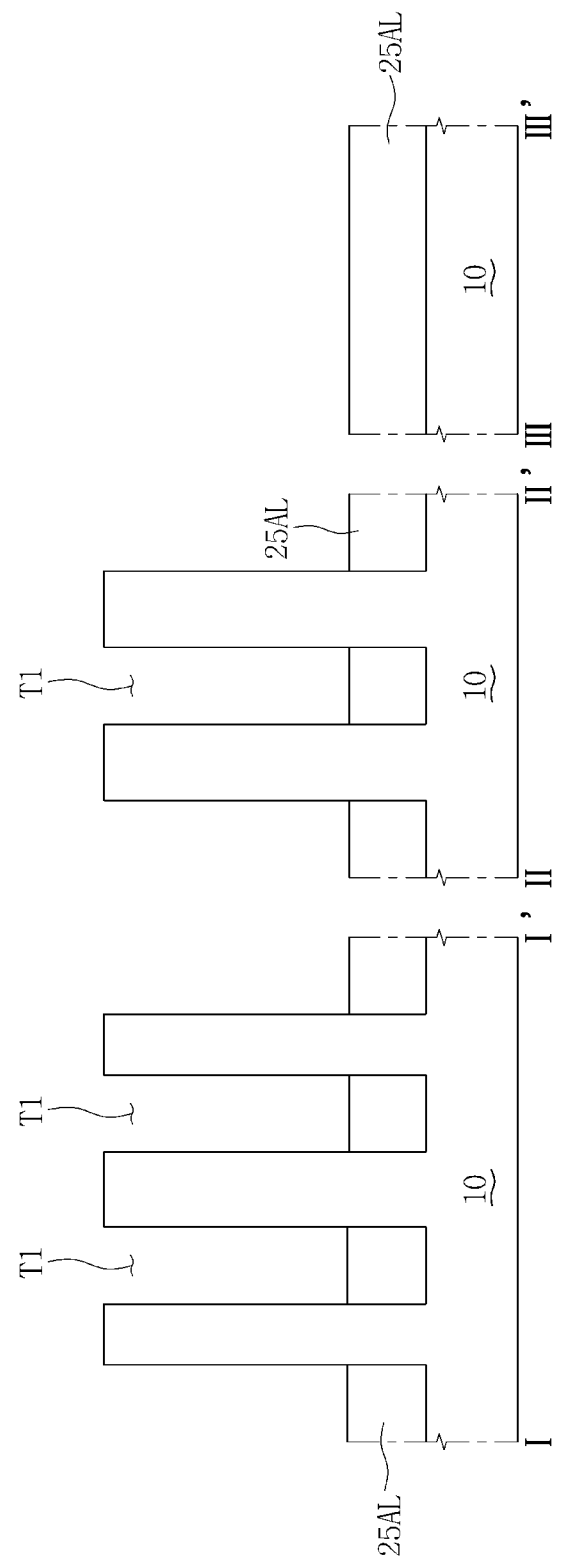

Referring to FIGS. 4A and 4B, the method may include forming lower active gate blocking patterns 25AL to fill lower portions of the first trenches T1. The lower active gate blocking patterns 25AL may include, for example, silicon oxide. The forming of the lower active gate blocking patterns 25AL may include forming a silicon oxide layer on the substrate 10 to fill the first trenches T1, and removing the silicon oxide layer to form the lower active gate blocking patterns 25AL on the lower portions of the first trenches T1 by performing an etch-back process. For example, the first mask patterns M1 may be removed at the same time as partially removing the silicon oxide in the first trenches T1.

Figure 5A:
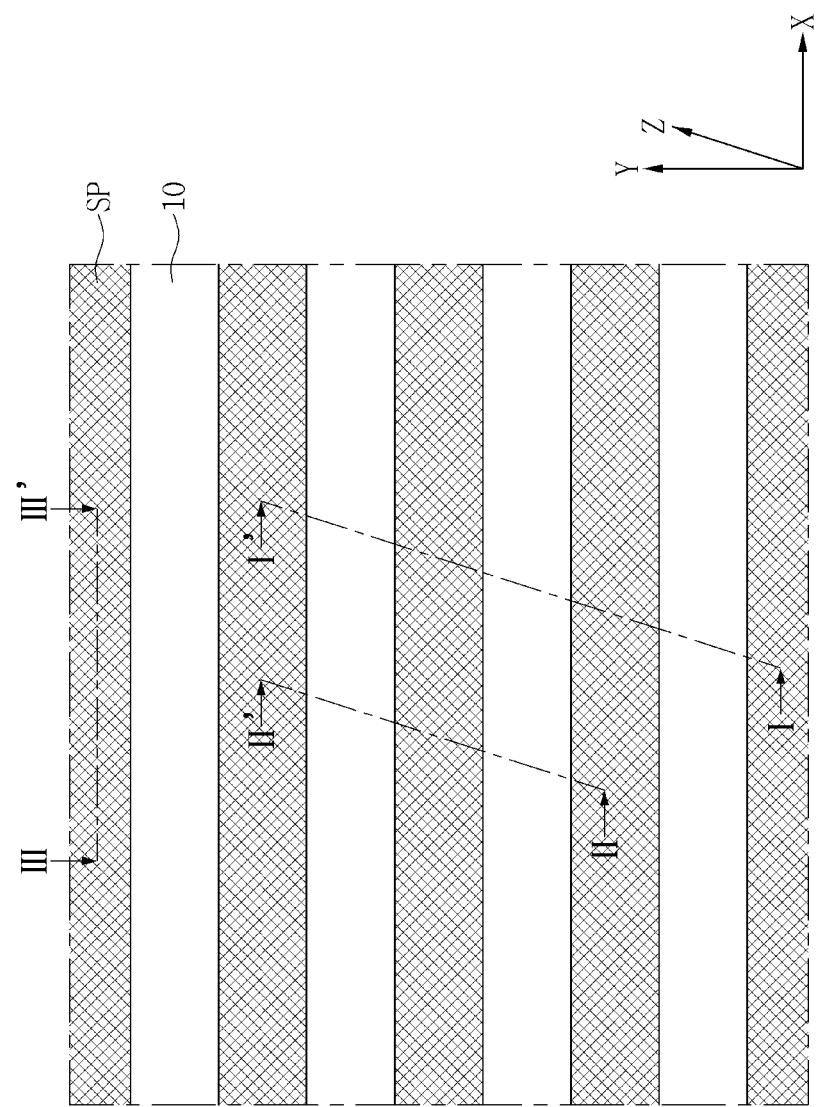
Figure 5B:
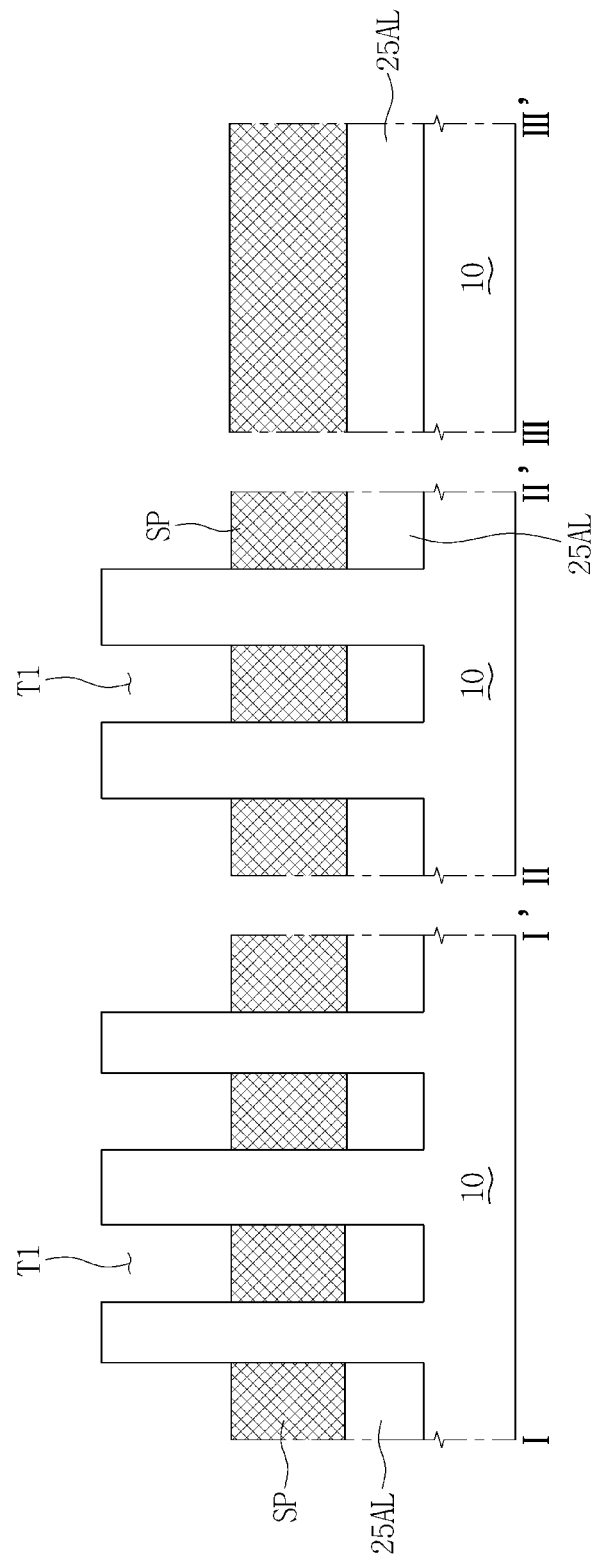

Referring to FIGS. 5A and 5B, the method may include forming sacrificial patterns SP on the lower active gate blocking patterns 25AL in the first trenches T1. The sacrificial patterns SP may include, for example, silicon-germanium SiGe or silicon nitride SiN. The forming of the sacrificial patterns SP may include forming sacrificial layers on the substrate 10 to fill the first trenches T1, and removing the sacrificial layer to form the sacrificial patterns SP partially filling the first trenches T1 by performing an etch-back process.

Figure 6B:
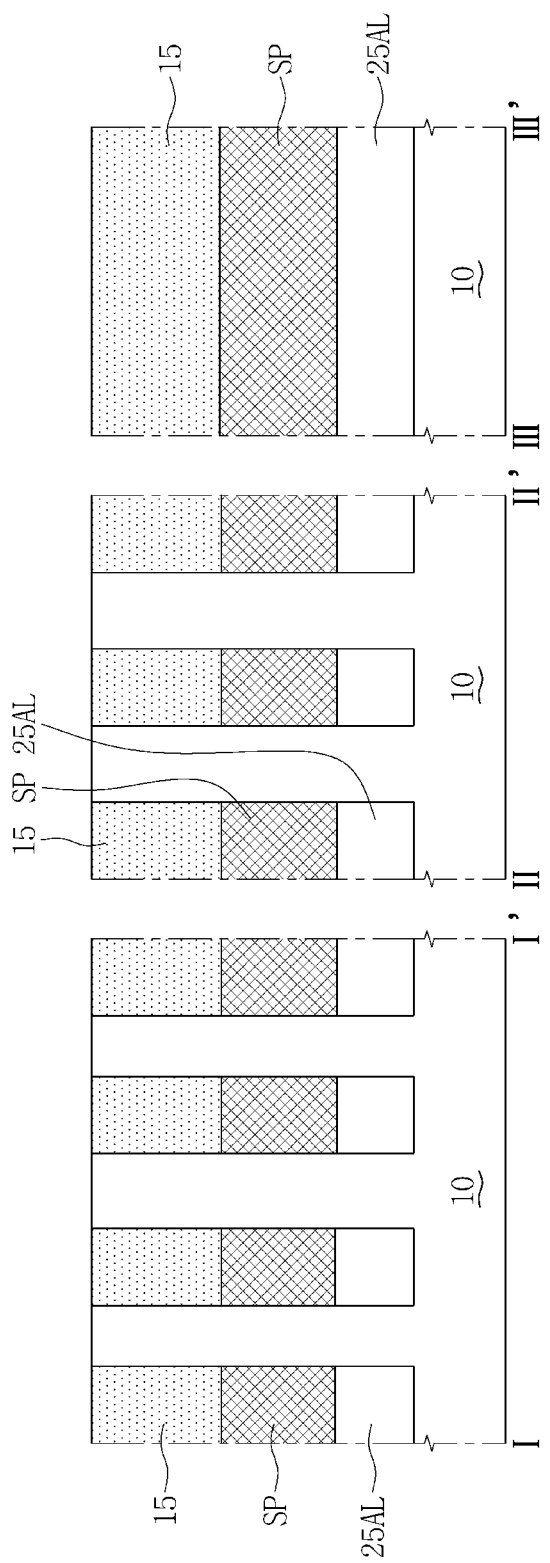

Referring to FIGS. 6A and 6B, the method may include forming poly-crystalline silicon patterns 15 on the sacrificial patterns SP in the first trenches T1 to fully fill the first trenches T1. The forming of the poly-crystalline silicon patterns 15 may include forming a poly-crystalline silicon layer on the substrate 10 to fill the first trenches T1, and removing the poly-crystalline silicon layer on the substrate 10 to expose a surface of the substrate 10 by performing a planarization process.

Figure 7A:
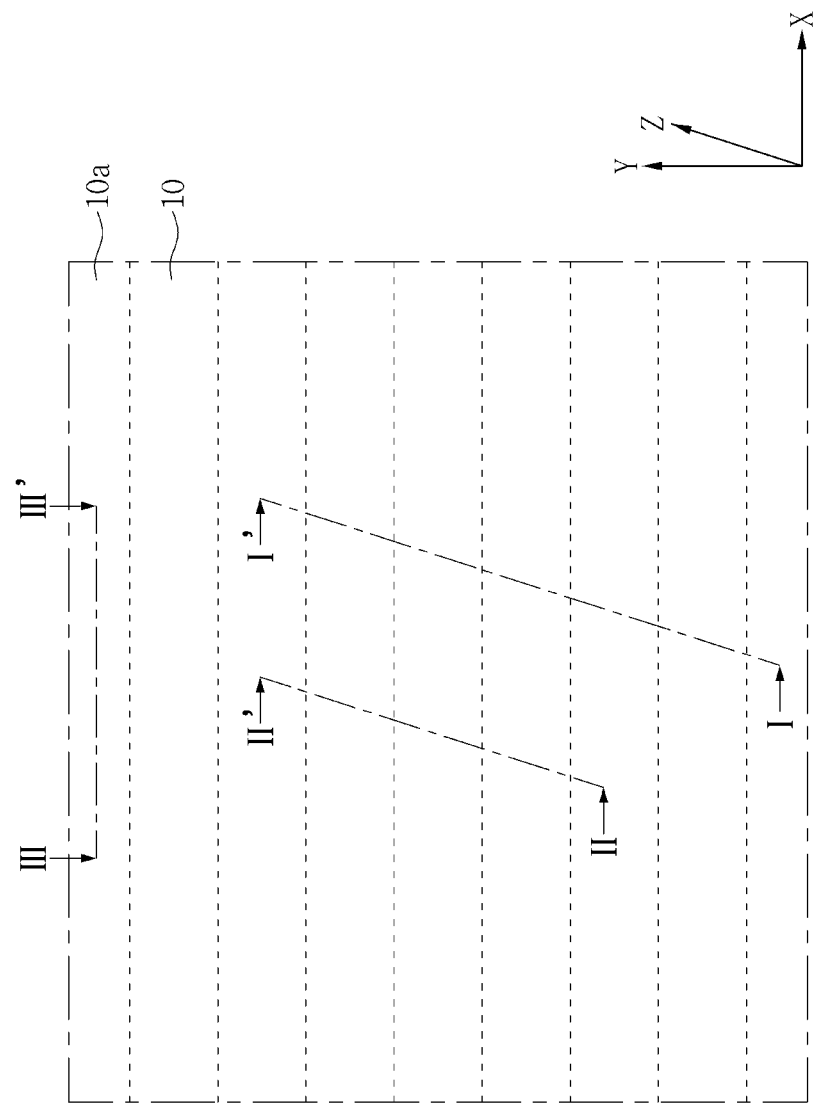
Figure 7B:
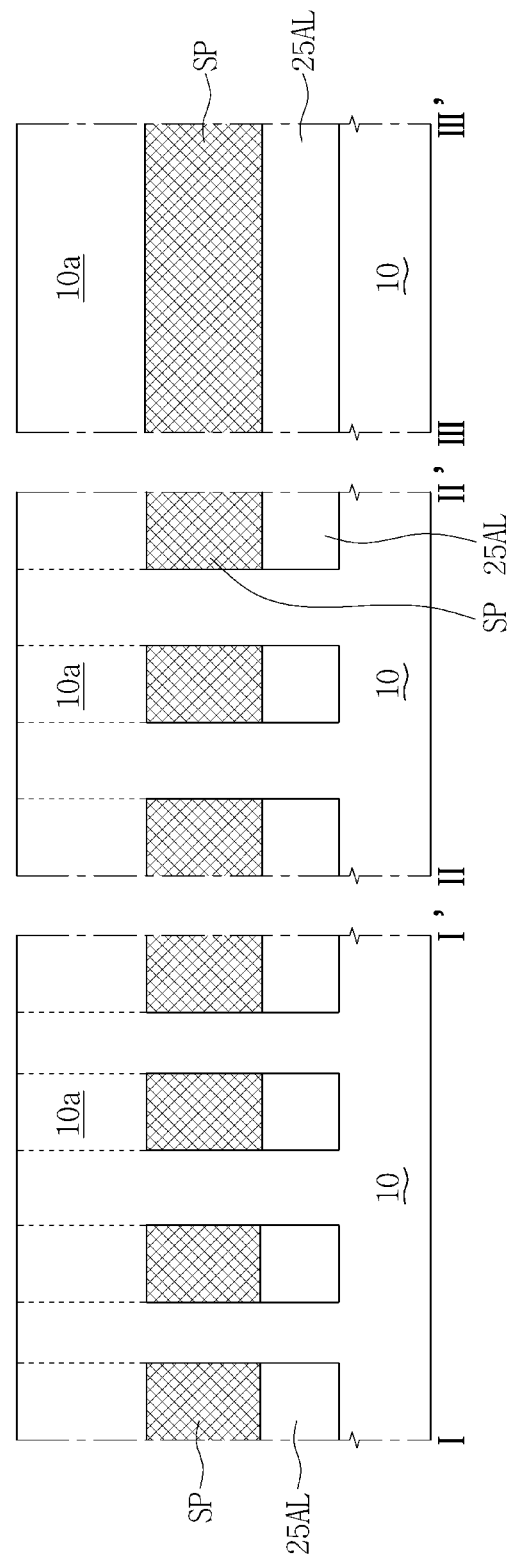

Referring to FIGS. 7A and 7B, the method may include changing the poly-crystalline silicon patterns 15 to single-crystalline silicon patterns 10$a$ by performing a single crystallization process. The single crystallization process may include, for example, a laser process, a thermal treatment process, a rapid thermal process (RTP), or an annealing process using a furnace. When the single crystallization process is performed, the poly-crystalline silicon patterns 15 may be single-crystallized using the substrate 10 located at both sides of the poly-crystalline silicon patterns 15 as single crystallization seeds. Accordingly, boundaries (dotted lines) between single-crystalline silicon patterns 10$a$ and the substrate 10 may disappear.

Figure 8A:
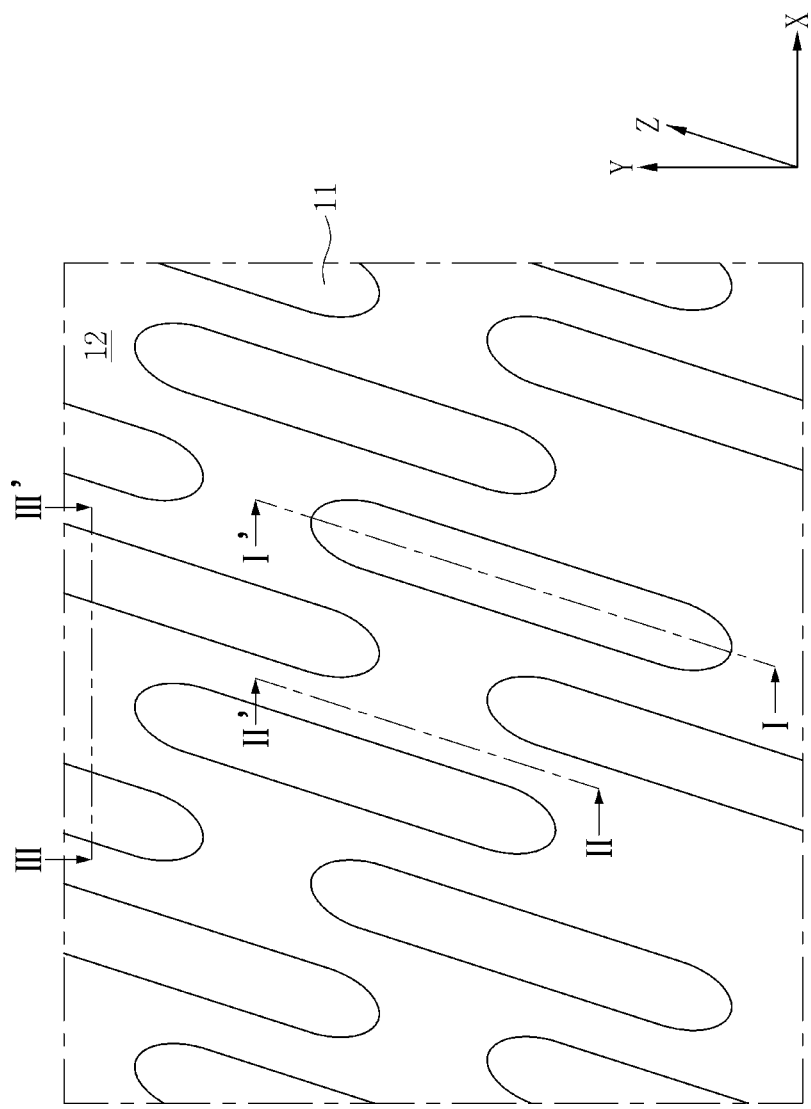
Figure 8B:
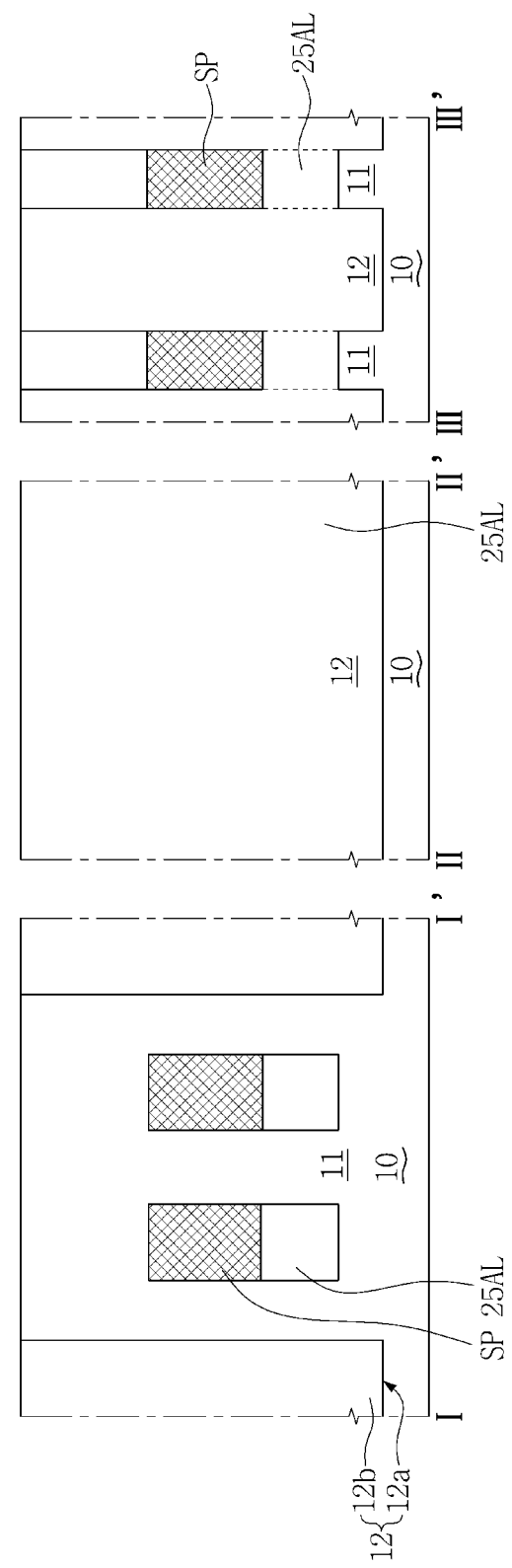

Referring to FIGS. 8A and 8B, the method may include forming a device isolation region 12 defining active regions 11 in the substrate 10. The forming of the device isolation region 12 may include performing a shallow trench isolation (STI) process. The STI process may include forming a device isolation trench 12$a$ in the substrate 10 and filling the device isolation trench 12$a$ with a device isolation insulating material 12$b$. The device isolation insulating material 12$b$ may include, for example, silicon oxide.

Figure 9A:
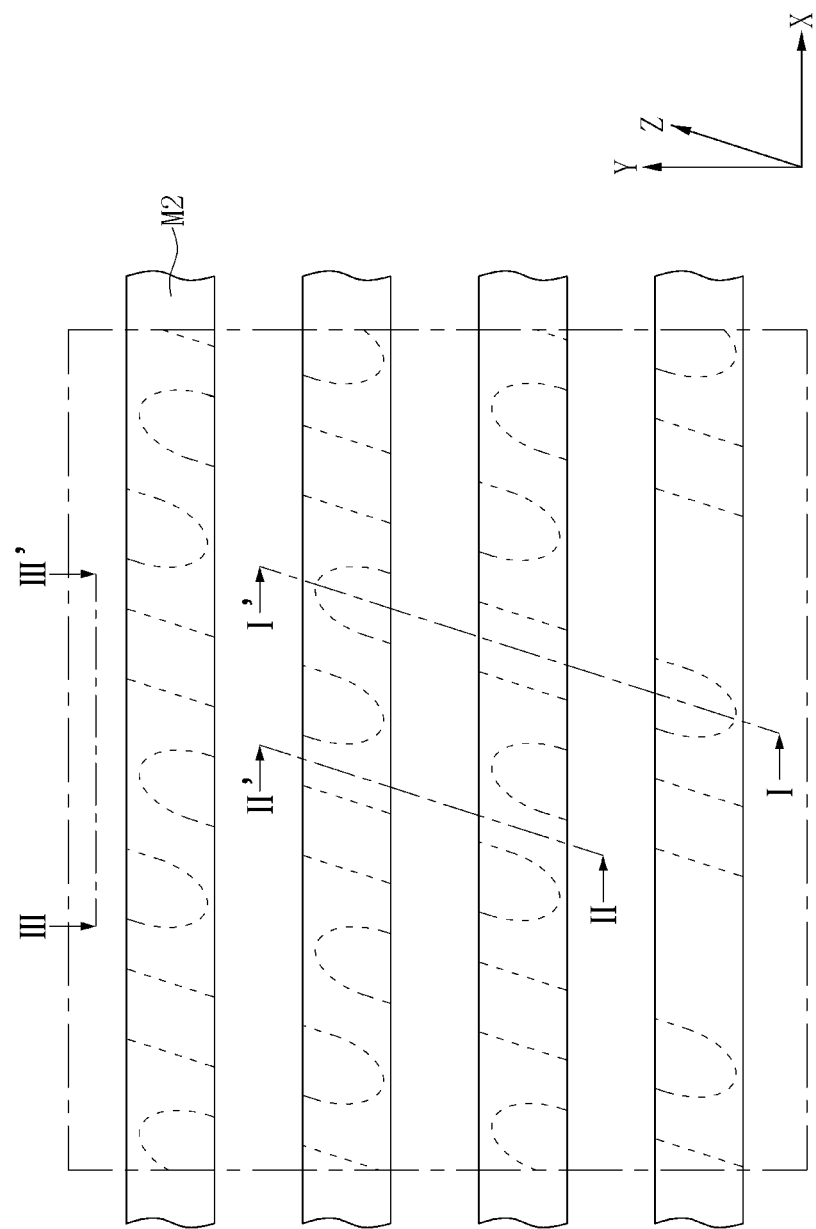
Figure 9B:
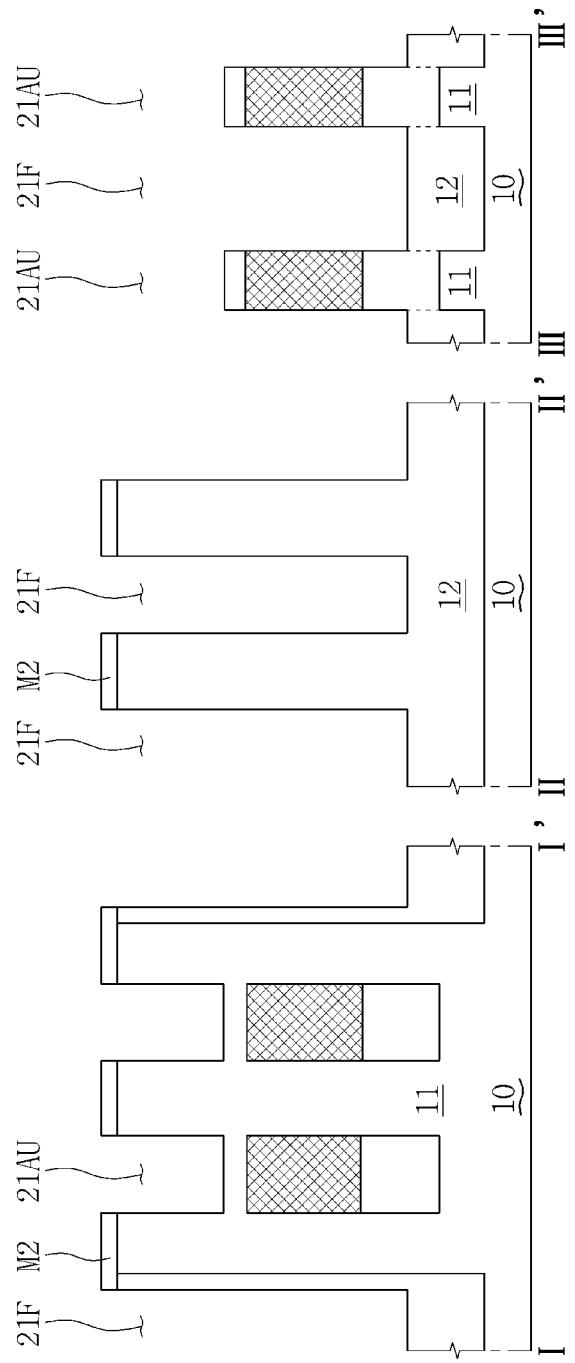

Referring to FIGS. 9A and 9B, the method may include forming second mask patterns M2 on the active regions 11 and the device isolation region 12, and forming upper active gate trenches 21AU and field gate trenches 21F in the substrate 10 by performing an etching process using the second mask patterns M2 as an etching mask. Each of the second mask patterns M2 may extend in the X direction, and be disposed spaced apart from and parallel to each other in the Y direction. By forming the upper active gate trenches 21AU and the field gate trenches 21F, the sacrificial patterns SP formed in the active regions 11 may be exposed. For example, side surfaces of the sacrificial patterns SP may be exposed in the field gate trenches 21F.

Figure 10:
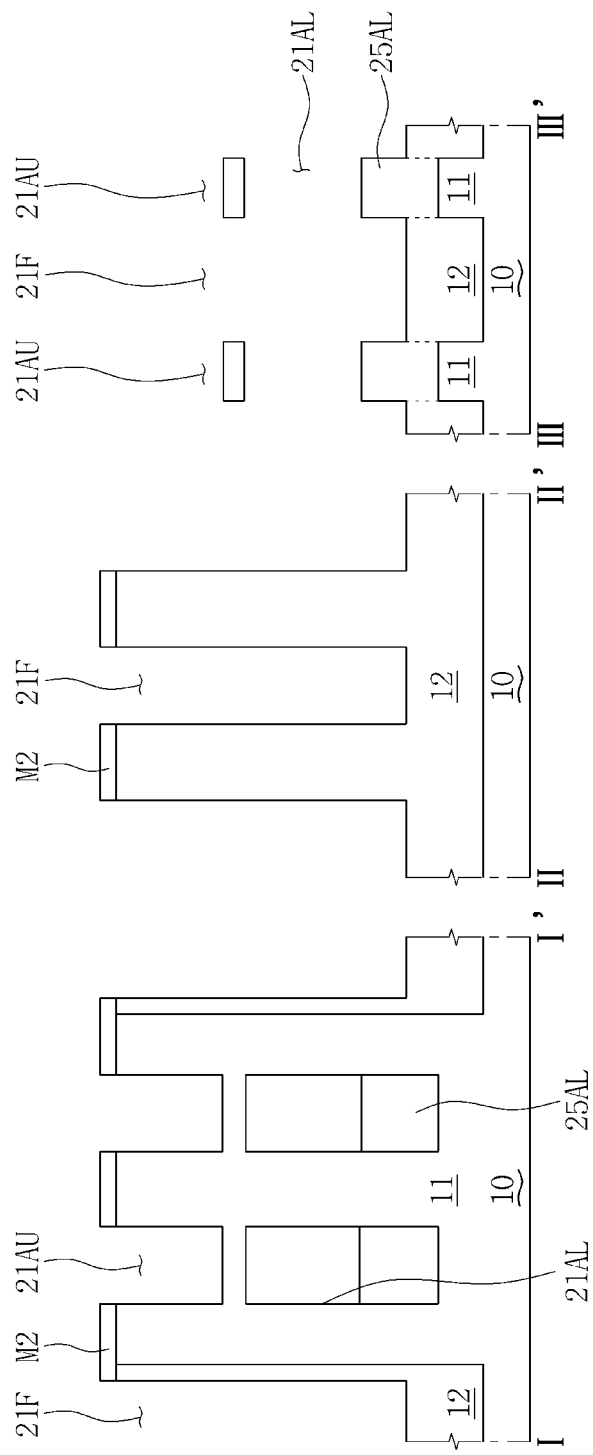

Referring to FIG. 10, the method may include removing the exposed sacrificial patterns SP. When the sacrificial patterns SP are removed, lower active gate tunnels 21AL on the lower active gate blocking patterns 25AL in the active regions 11 may be formed.

Figure 11:
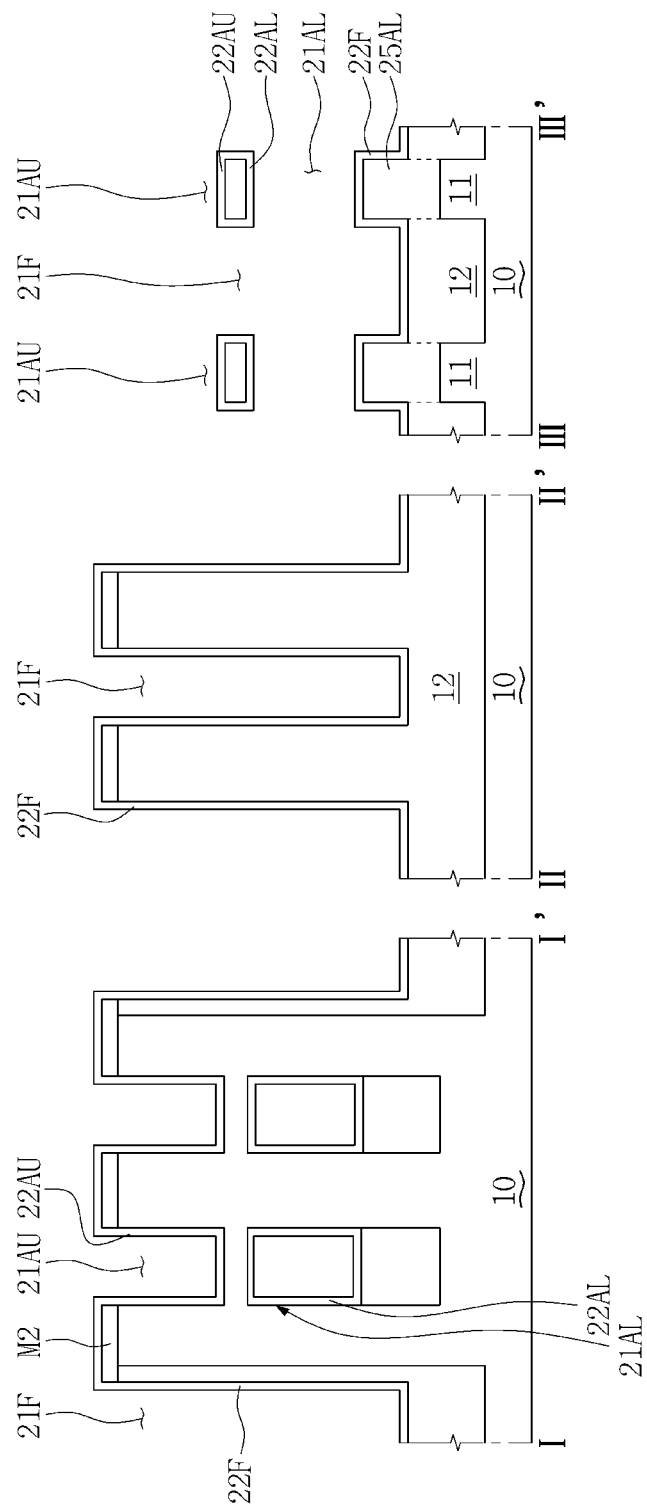

Referring to FIG. 11, the method may include conformally forming an upper active gate insulating layer 22AU, lower active gate insulating layers 22AL and field gate insulating layers 22F on inner walls of the upper active gate trenches 21AU, the lower active gate tunnels 21AL and the field gate trenches 21F, respectively. The upper active gate insulating layer 22AU, the lower active gate insulating layer 22AL, and the field gate insulating layer 22F may include silicon oxide or a metal oxide. The metal oxide may include hafnium oxide, aluminum oxide, or titanium oxide. The upper active gate insulating layer 22AU, the lower active gate insulating layer 22AL, and the field gate insulating layer 22F may be formed using, for example, an atomic layer deposition (ALD) process and/or a thermal oxidation process. When the gate insulating layer 22 is formed using the thermal oxidation process, the upper active gate insulating layer 22AU, the lower active gate insulating layer 22AL, and the field gate insulating layer 22F may not be formed on top surfaces of the second mask patterns M2, top surfaces of the lower active gate blocking patterns 25AL exposed in the lower active gate tunnels 21AL, and inner walls of the field gate trenches 21F.

Figure 12:
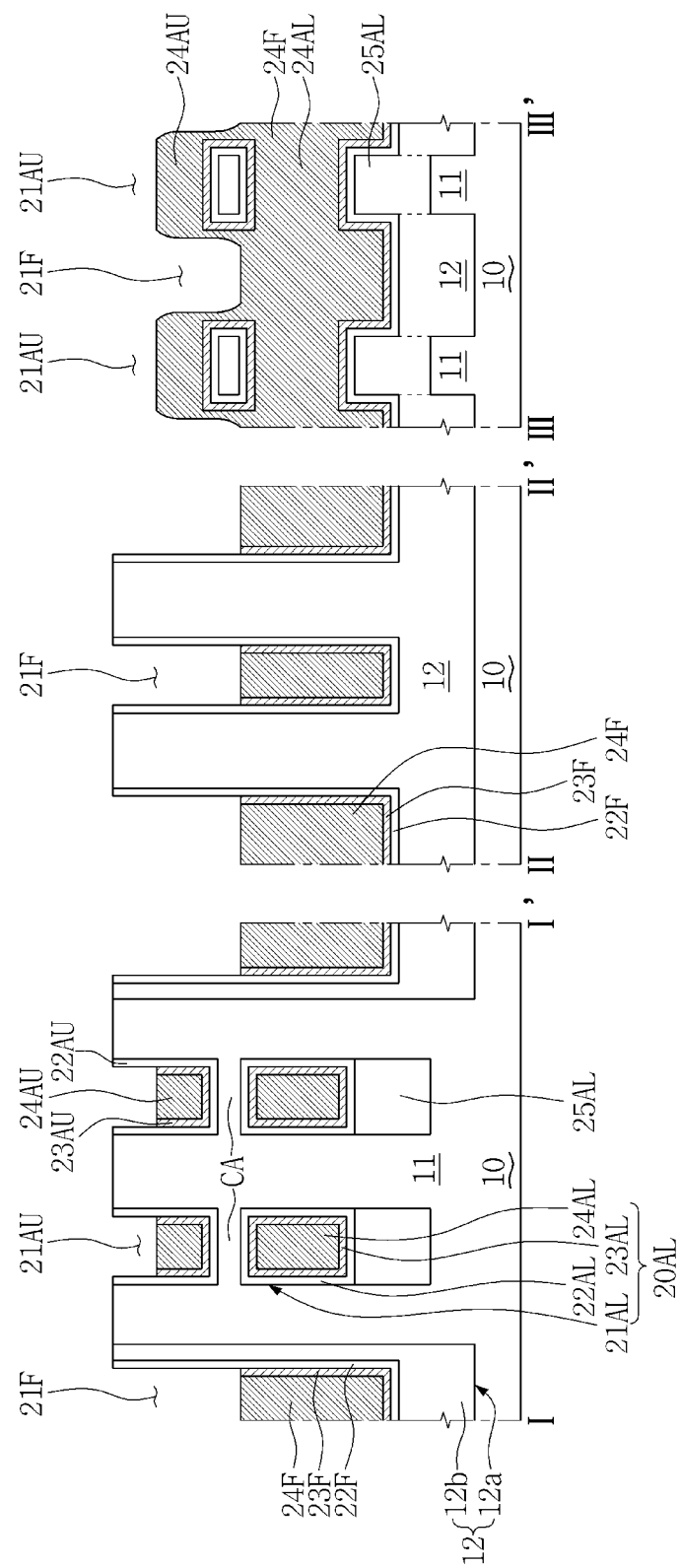

Referring to FIG. 12, the method may include forming upper active gate barrier patterns 23AU and upper active gate electrode patterns 24AU partially filling the upper active gate trenches 21AU, forming lower active gate barrier patterns 23AL and lower active gate electrode patterns 24AL fully filling the lower active gate tunnels 21AL, and forming field gate barrier pattern 23F and field gate electrode patterns 24F partially filling the field gate trenches 21F.

The forming of the upper active gate barrier patterns 23AU and the upper active gate electrode patterns 24AU, the lower active gate barrier patterns 23AL and the lower active gate electrode patterns 24AL, and the field gate barrier patterns 23F and the field gate electrode patterns 24F may include the following process.

First, the process may include conformally forming a gate barrier layer on the upper active gate insulating layer 22AU, the lower active gate insulating layer 22AL, and the field gate insulating layer 22F. The gate barrier layer may be formed by performing an ALD process. The gate barrier layer may include a barrier metal compound such as titanium nitride (TiN) or tantalum nitride (TaN).

Next, the process may include forming a gate electrode layer on the gate barrier layer filling the upper active gate trenches 21AU, the lower active gate tunnels 21AL, and the field gate trenches 21F. The gate electrode layer may be formed by performing an ALD process or a chemical vapor deposition (CVD) process. The gate electrode layer may include a metal such as tungsten or copper.

Next, the process may include forming the upper active gate barrier patterns 23AU and the upper active gate electrode patterns 24AU, the lower active gate barrier patterns 23AL and the lower active gate electrode patterns 24AL, and the field gate barrier patterns 23F and the field gate electrode patterns 24F by partially removing upper portions of the gate barrier layer and the gate electrode layer in the upper active gate trenches 21AU and the field gate trenches 21F by performing an etch-back process. At this time, top surfaces of the upper active gate barrier patterns 23AU are coplanar with top surfaces of the upper active gate electrode patterns 24AU. Also, top surfaces of the field gate barrier patterns 23F are coplanar with top surfaces of the field gate electrode patterns 24F.

Further, the top surfaces of the field gate barrier patterns 23F and top surfaces of the field gate electrode patterns 24F are located at lower levels than the top surfaces of the upper active gate barrier patterns 23AU and top surfaces of the upper active gate electrode patterns 24AU, respectively. This can be implemented by varying etching conditions for the gate barrier layer and the gate electrode layer on the upper active gate trenches 21AU, and the gate barrier layer and the gate electrode layer on the field gate trenches 21F. Alternatively, this can be implemented by forming widths of the upper active gate trenches 21AU smaller than widths of the field gate trenches 21F and etching the gate barrier layer and the gate electrode layer on the upper active gate trenches 21AU with a rate slower than the gate barrier layer and the gate electrode layer on the field gate trenches 21F.

Referring to FIG. 2A, the above method may include forming upper active gate capping insulating patterns 25AU on the upper active gate insulating layer 22AU, the upper active gate barrier patterns 23AU, and upper active gate electrode patterns 24AU to fill the upper active gate trenches 21AU and forming field gate capping insulating patterns 25F on the field gate insulating layer 22F, the field gate barrier patterns 23F, and the field gate electrode patterns 24F to fill the field gate trenches 21F. The upper active gate capping insulating patterns 25AU and the field gate capping insulating patterns 25F may include silicon nitride.

FIGS. 13 to 19 are cross-sectional views taken along lines I-I', II-II' and III-III' of FIG. 1 for describing a method of fabricating a semiconductor device 100B according to example embodiments. In the example embodiments, detailed descriptions of the same content as those of the above-described embodiments will be omitted.

Referring to FIGS. 3A and 3B, a method of fabricating a semiconductor device 100B according to example embodiments may include forming the first mask patterns M1 on the substrate 10, and forming the first trenches T1 in the substrate 10 by performing an etching process using the first mask patterns M1 as an etching mask.

Figure 13:
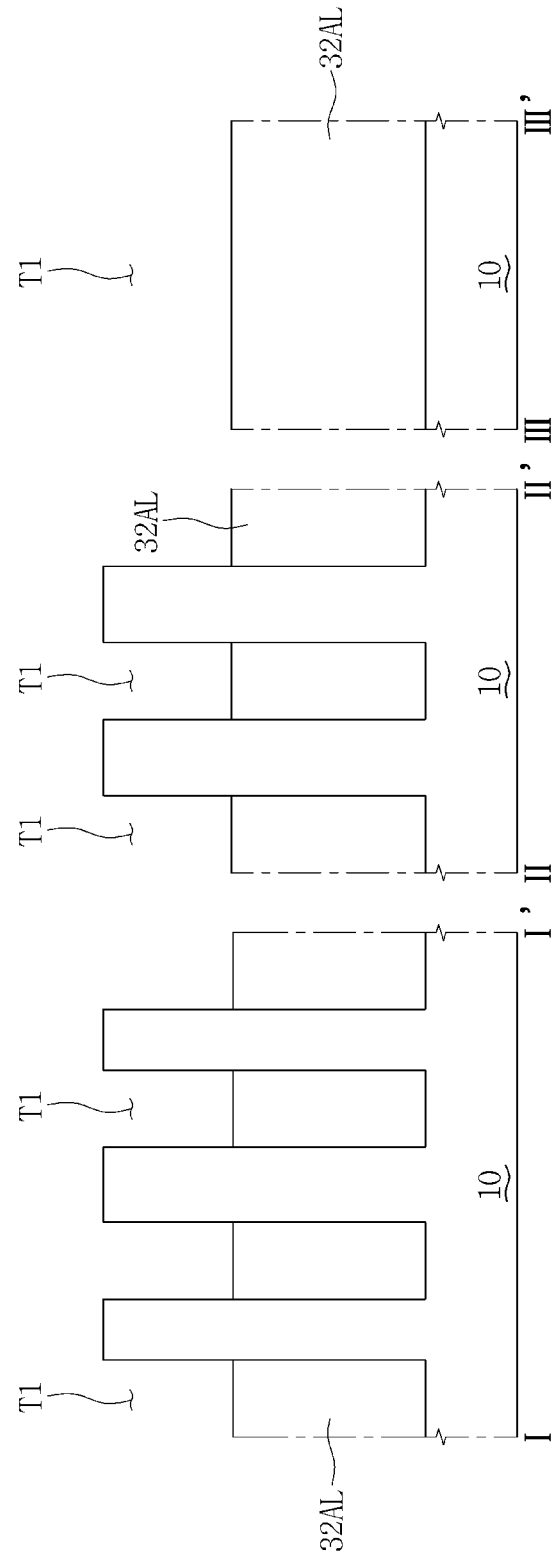

Referring to FIG. 13, the method may include filling lower portions of the first trenches T1 with a lower active gate insulating material 32AL. The lower active gate insulation material 32AL may include, for example, silicon oxide.

Figure 14:
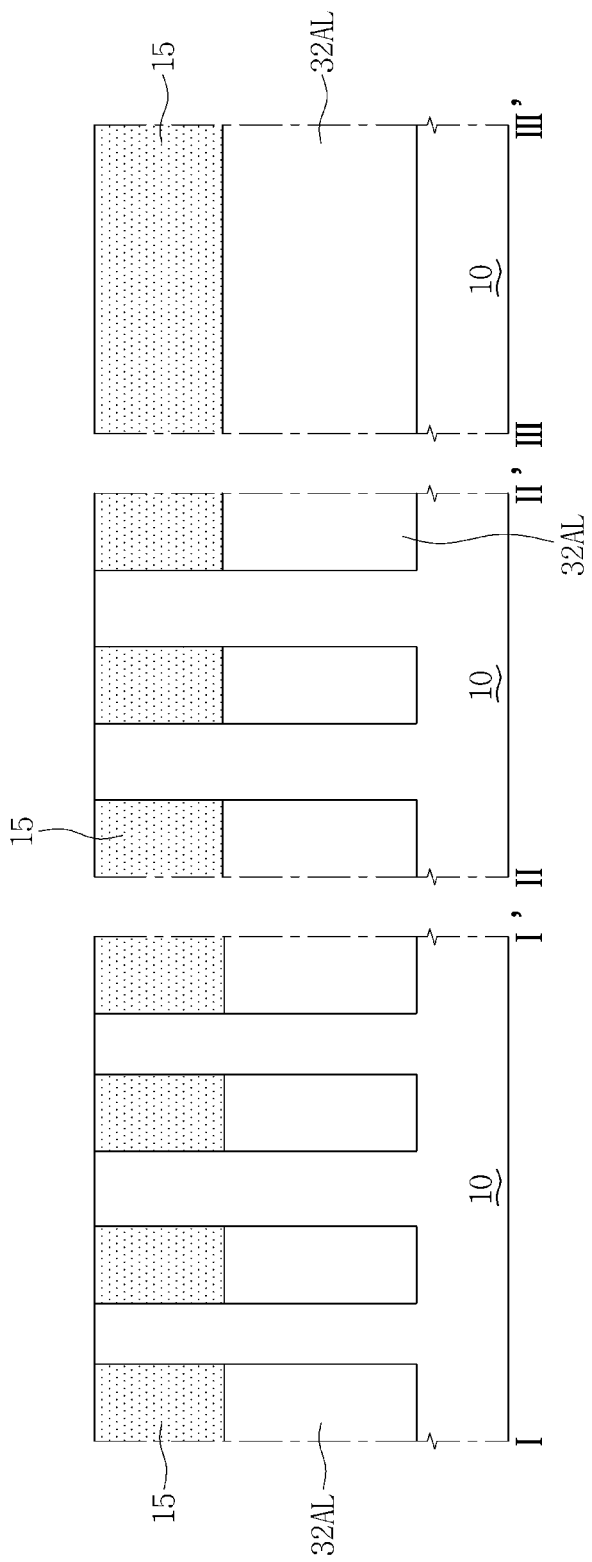

Referring to FIG. 14, the method may include forming poly-crystalline silicon patterns 15 on the lower active gate material 32AL in the first trenches T1 to fully fill the first trenches T1.

Figure 15:
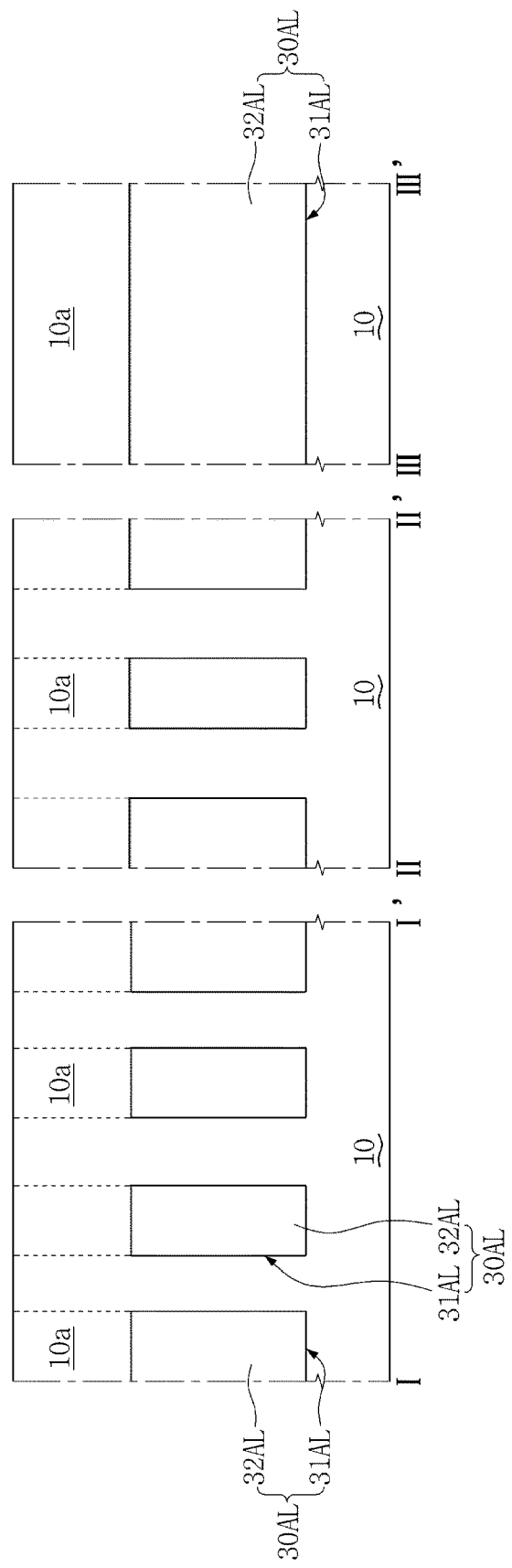

Referring to FIG. 15, the method may include changing the poly-crystalline silicon patterns 15 to single-crystalline silicon patterns 10a by performing a single crystallization process. The single crystallization process may include, for example, a laser process, a thermal treatment process, an RTP, or an annealing process using a furnace. Boundaries (dotted lines) between single-crystalline silicon patterns 10a formed by the single crystallization process and the substrate 10 may disappear. As the single crystallization process is performed, lower active gate insulating structures 30AL in which lower active gate insulating tunnels 31AL are filled with the lower active gate material 32AL may be formed.

Figure 16:
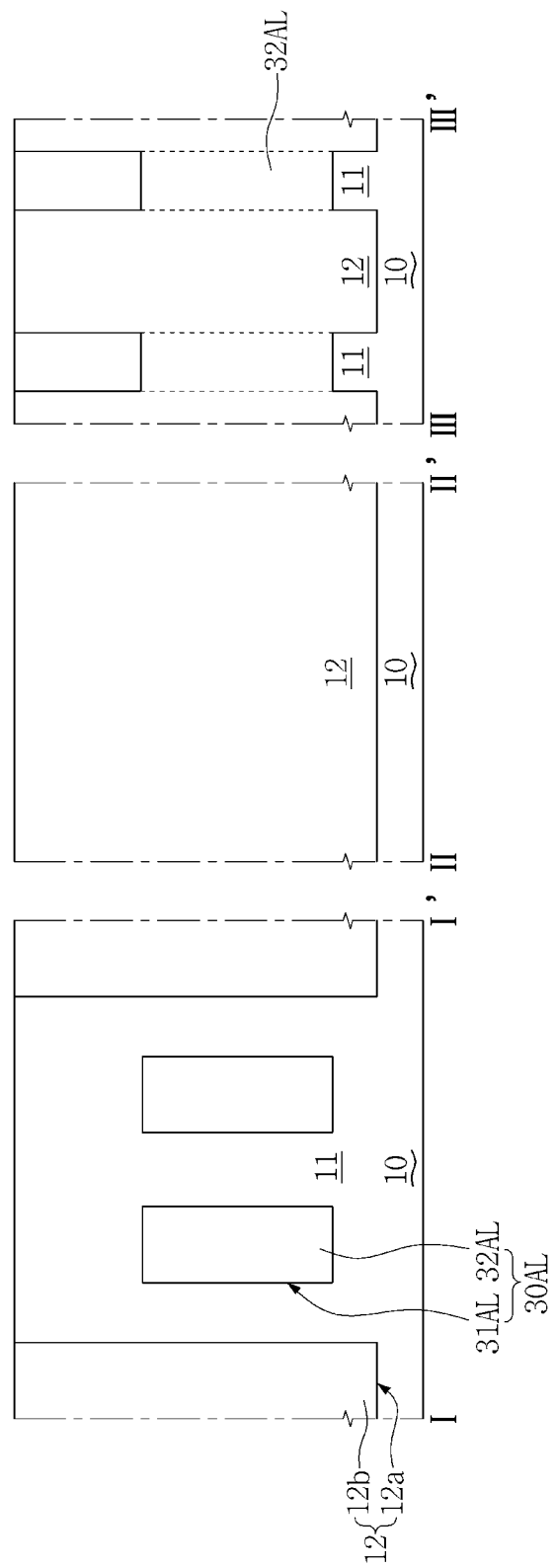

Referring to FIG. 16, the method may include forming a device isolation region 12 defining active regions 11 in the substrate 10. The forming of the device isolation region 12 may include performing an STI process. The STI process may include forming a device isolation trench 12a in the substrate 10 and filling the device isolation trench 12a with a device isolation insulating material 12b. The device isolation insulating material 12b may include silicon oxide.

Figure 17:
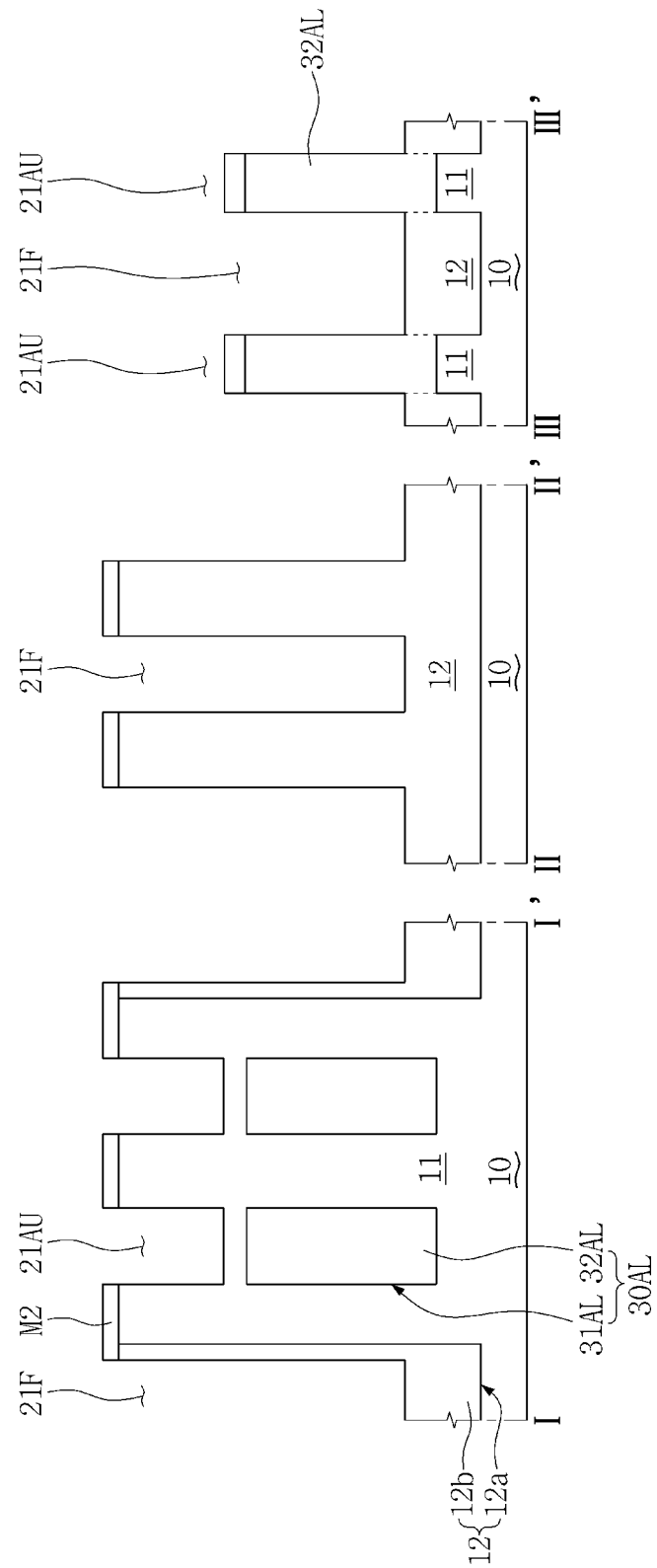

Referring to FIG. 17, the method may include forming second mask patterns M2 in the active regions 11 and the device isolation region 12, and forming upper active gate trenches 21AU and field gate trenches 21F in the substrate 10 by performing an etching process using the second mask patterns M2 as an etching mask.

Figure 18:
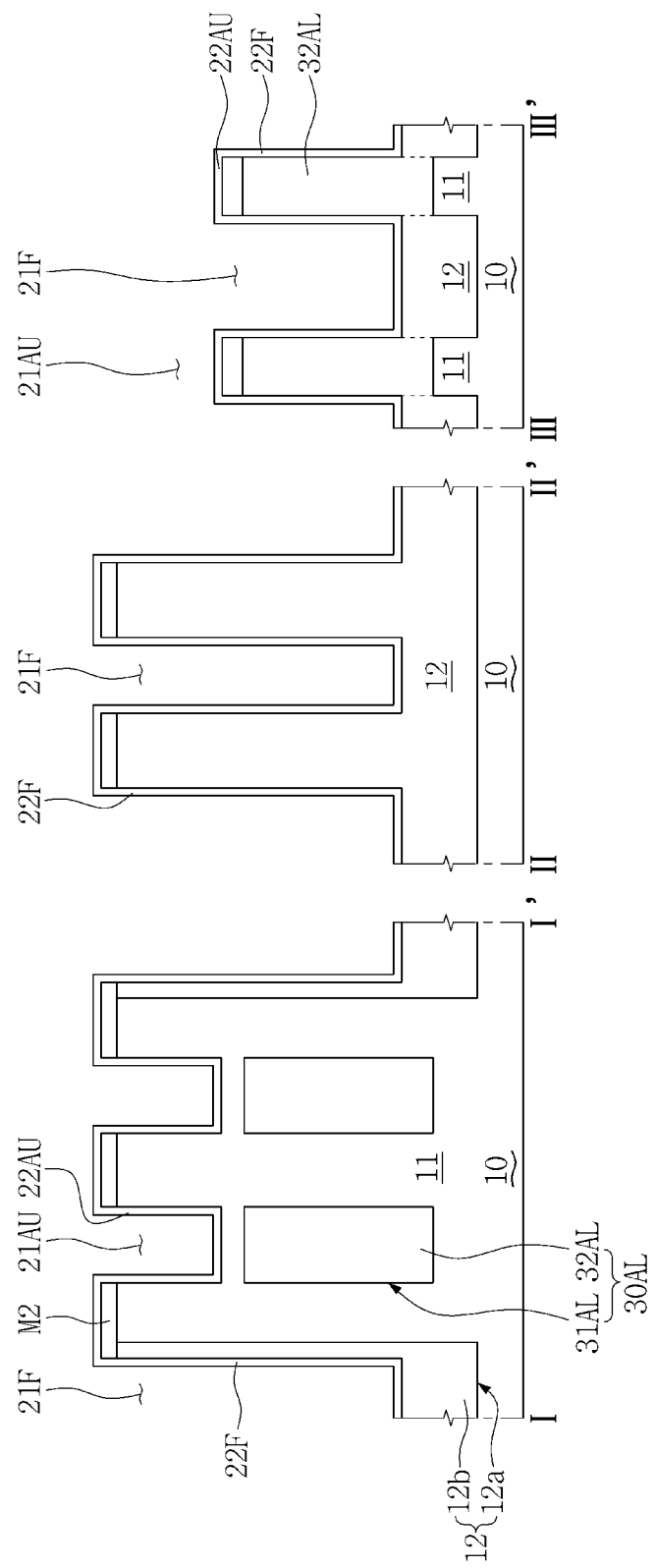

Referring to FIG. 18, the method may include conformally forming upper active gate insulating layers 22AU and field gate insulating layers 22F on inner walls of the upper active gate trenches 21AU and the field gate trenches 21F, respectively. The upper active gate insulating layer 22AU and the field gate insulating layer 22F may include silicon oxide or a metal oxide. The metal oxide may include hafnium oxide, aluminum oxide, or titanium oxide. The upper active gate insulating layer 22AU and the field gate insulating layer 22F may be formed using, for example, an ALD process and/or a thermal oxidation process.

Figure 19:
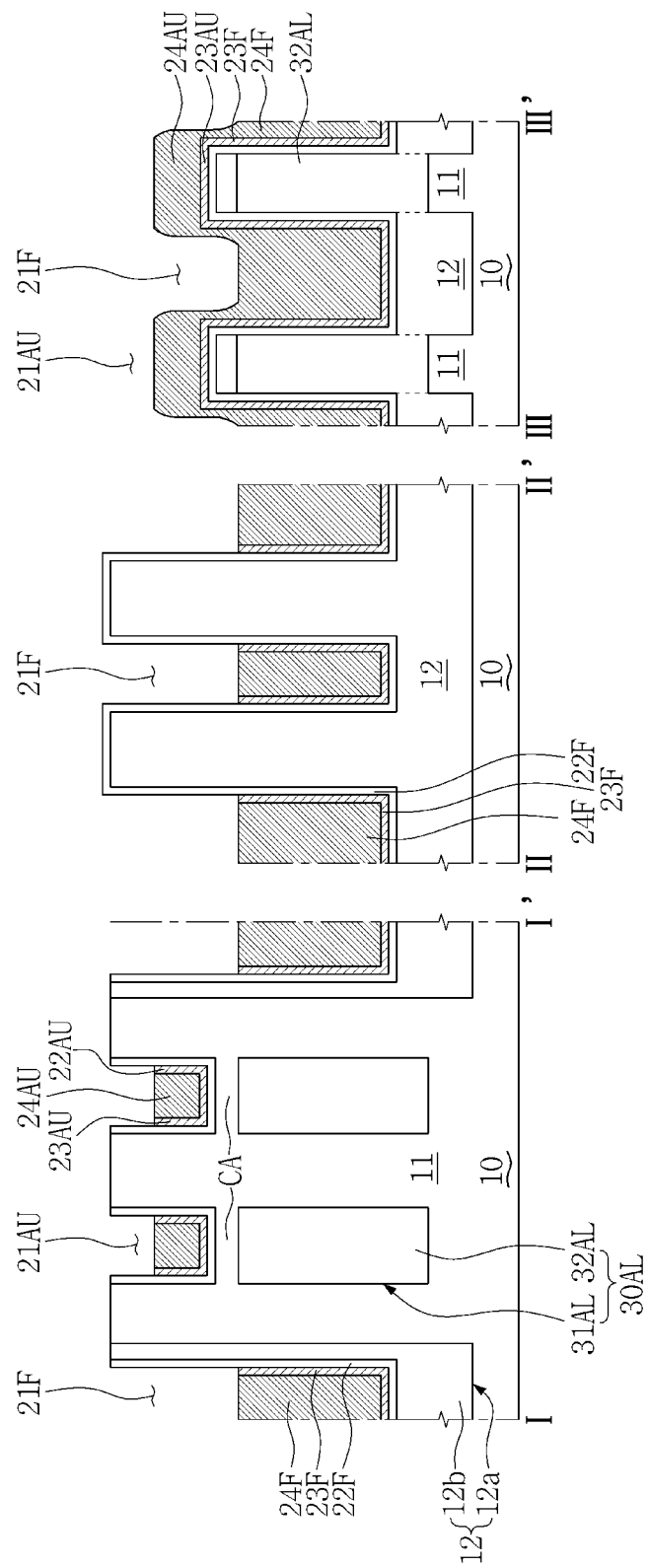

Referring to FIG. 19, the method may include forming upper active gate barrier patterns 23AU and upper active gate electrode patterns 24AU partially filling the upper active gate trenches 21AU and forming field gate barrier patterns 23F and field gate electrode patterns 24F partially filling the field gate trenches 21F.

Referring to FIG. 2B, the method may include forming upper active gate capping insulating patterns 25AU on the upper active gate insulating layer 22AU, the upper active gate barrier patterns 23AU, and upper active gate electrode patterns 24AU to fill the upper active gate trenches 21AU and forming field gate capping insulating patterns 25F on the field gate insulating layer 22F, the field gate barrier patterns 23F, and the field gate electrode patterns 24F to fill the field gate trenches 21F. The upper active gate capping insulating patterns 25AU and the field gate capping insulating patterns 25F may include silicon nitride.

Figure 20:
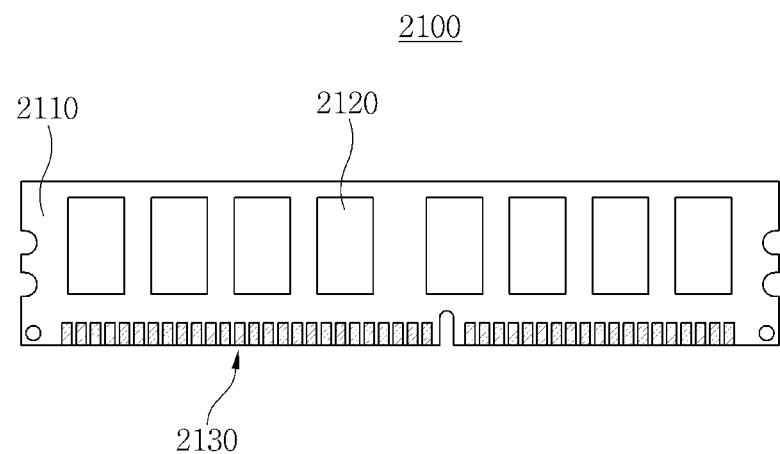
FIG. 20 is a diagram conceptually showing a memory module according to certain embodiments.

FIG. 20 is a diagram conceptually showing a memory module 2100 including at least one of the semiconductor devices 100A to 100D according to certain embodiments. Referring to FIG. 20, the memory module 2100 may include a module substrate 2110, a plurality of memory devices 2120 disposed on the module substrate 2110, and a plurality of terminals 2130 disposed on a side of the module substrate 2110. The module substrate 2110 may include a printed circuit board (PCB). The memory devices 2120 may include one of the semiconductor devices 100A to 100D according to various embodiments described herein. The plurality of terminals 2130 may include a metal such as copper. Each of the terminals 2130 may be electrically connected to each of the memory devices 2120. Since the memory module 2100 includes memory devices 2120 having a low leakage current and superior carrier mobility, device performance can be improved.

Figure 21:
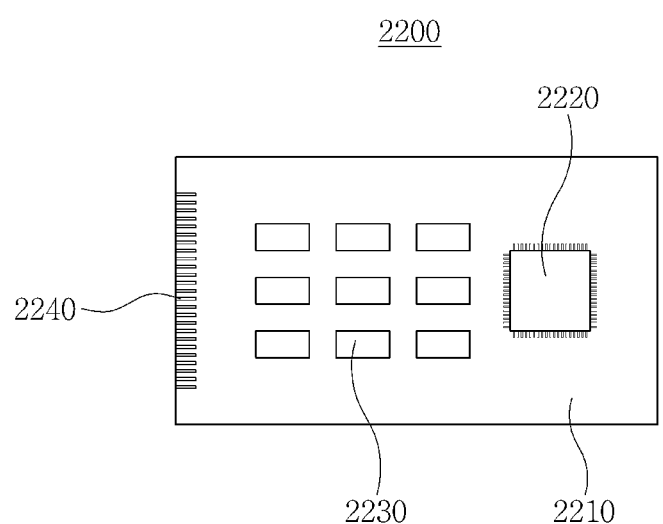
FIG. 21 is a diagram conceptually showing a semiconductor module according to certain embodiments.

FIG. 21 is a diagram conceptually showing a semiconductor module 2200 in accordance with example embodiments. Referring to FIG. 21, the semiconductor module 2200 may include a processor 2220 mounted on a module substrate 2210, and semiconductor devices 2230. The processor 2220 or the semiconductor devices 2230 may include at least one of the semiconductor devices 100A to 100D according to various embodiments described herein. Conductive input/output terminals 2240 may be disposed on at least one side of the module substrate 2210.

Figure 22:
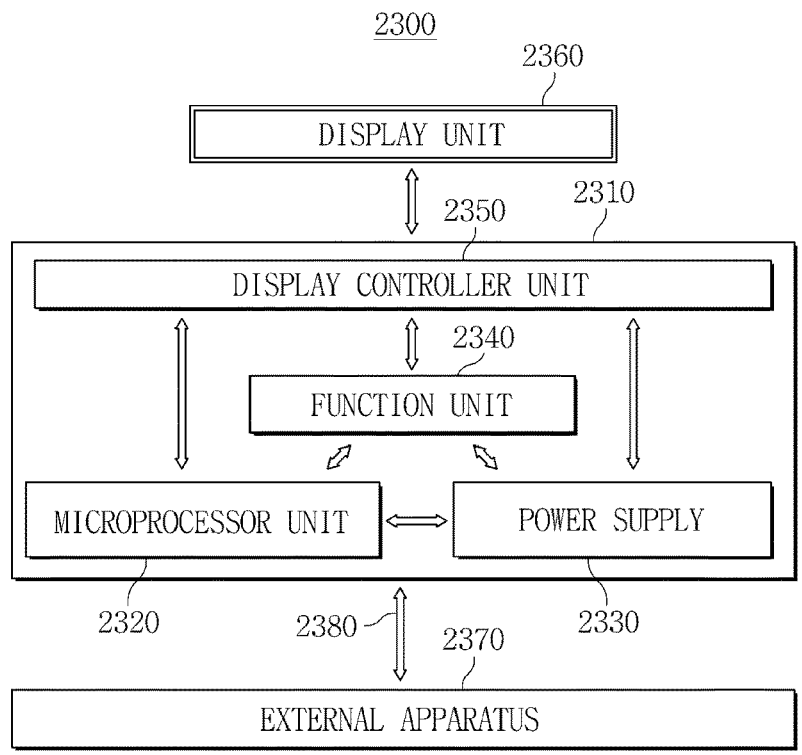
FIGS. 22 and 23 are block diagrams conceptually showing electronic systems according to certain embodiments.

FIG. 22 is a block diagram conceptually showing an electronic system 2300 in accordance with example embodiments. Referring to FIG. 22, the electronic system 2300 may include a body 2310, a display unit 2360, and an external apparatus 2370. The body 2310 may include a microprocessor unit 2320, a power supply 2330, a function unit 2340, and/or a display controller unit 2350. The body 2310 may be a system board or motherboard including a PCB and/or a case. The microprocessor unit 2320, the power supply 2330, the function unit 2340, and the display controller unit 2350 may be mounted or disposed on a top surface or an inside of the body 2310. The display unit 2360 may be disposed on the top surface of the body 2310 or an inside/outside of the body 2310. The display unit 2360 may display an image processed by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for a dry cell, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-pad, a touch-screen, a volatile/nonvolatile memory, a memory card controller, a camera, a lighting, an audio and video playback processor, a wireless transmission/reception antenna, a speaker, a microphone, a USB port, and other units having various functions. The microprocessor unit 2320 or the function unit 2340 may include at least one of the semiconductor devices 100A to 100D according to various embodiments described herein.

Figure 23:
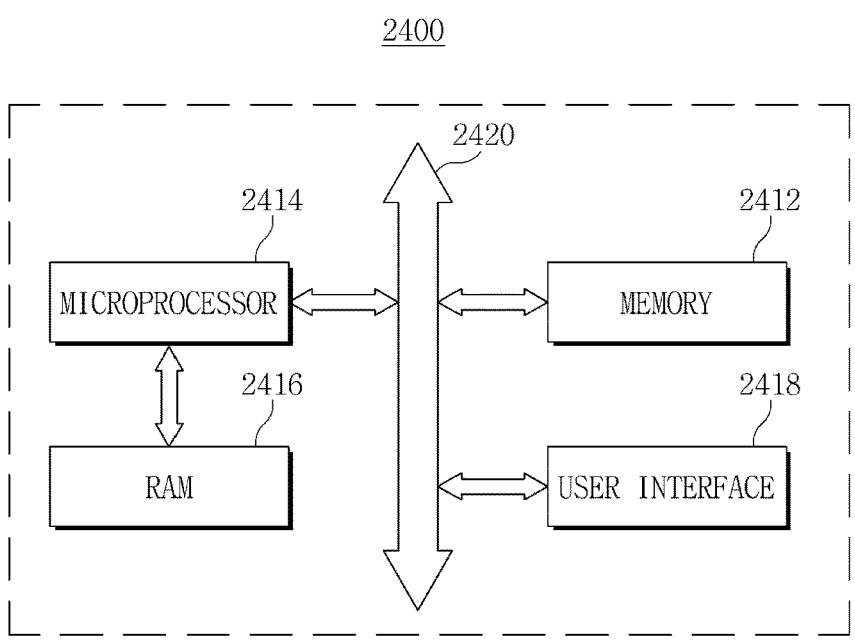

Referring to FIG. 23, an electronic system 2400 in accordance with example embodiments of the inventive concept may include a microprocessor 2414, a memory 2412, and a user interface 2418 which performs data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a lighting, or various other input/output devices. The memory 2412 may store codes for operating the microprocessor 2414, data processed by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 100A to 100D according to various embodiments described herein.

Semiconductor devices according to various embodiments described herein may include gate structures having upper gate structures and lower gate structures and vertically spaced apart from each other in the same active region. Accordingly, channels surrounded by the gate structures may be formed. As a result, interference between cell transistors can be prevented by blocking electron movement from one channel to an adjacent channel.

Further, in the semiconductor devices according to various embodiments described herein, a top surface of the field gate electrode formed in a device isolation region may be formed at a level lower than a bottom surface of an upper gate electrode formed in an active region. Accordingly, the gate induced drain leakage (GIDL) may be improved by removing the passing gate effect.

Furthermore, in the semiconductor devices according to various embodiments described herein, a vertical length of an upper gate structure in an active region may be shortened. Accordingly, a channel length may be reduced, and thus a read/write speed may be improved by increasing channel current.

Other various effects have been described in the above detailed descriptions.

Although a few embodiments have been described, those skilled in the art will readily appreciate that many modifications are possible without materially departing from the novel teachings and advantages. Accordingly, all such modifications are intended to be included within the scope of the invention as defined in the claims.

What is claimed is:

1. A semiconductor device comprising:
a device isolation region defining an active region in a substrate;
an upper active gate structure formed in the active region, the upper active gate structure including a first gate conductive layer;
a lower active gate structure formed in the active region, the lower active gate structure being formed vertically spaced apart from the upper active gate structure, and including a second gate conductive layer; and
a field gate structure in the device isolation region, the field gate structure including a third gate conductive layer,
wherein a top surface of the third gate conductive layer is higher than a top surface of the second gate conductive layer, and
wherein the upper active gate structure comprises:
an upper active gate trench formed from a surface of the substrate toward an inside of the substrate;
an upper active gate insulating layer conformally formed on an inner bottom surface of the upper active gate trench; and
air gaps formed on inner sidewalk of a lower portion of the upper active gate trench,
wherein the first gate conductive layer is formed on the upper active gate insulating layer and the air gaps of a lower portion of the upper active gate trench.

2. The semiconductor device of claim 1, wherein a vertical length of the third gate conductive layer is greater than a vertical length of the second gate conductive layer.

3. The semiconductor device of claim 2, wherein the third gate conductive layer is buried in an insulation layer.

4. The semiconductor device of claim 3, wherein the insulation layer comprises a silicon oxide.

5. The semiconductor device of claim 4, wherein a horizontal width of the upper active gate structure is substantially same with a horizontal width of the lower active gate structure.

6. The semiconductor device of claim 5, wherein a channel area is formed between the upper active gate structure and the lower active gate structure, and the channel area is connected to each of active regions located at both sides of the upper active gate structure.

7. The semiconductor device of claim 1, wherein the upper active gate insulating layer is conformally formed on an inner wall of the upper active gate trench.

8. The semiconductor device of claim 7, wherein the lower active gate structure comprises:
a lower active gate blocking pattern;
a lower active gate tunnel on the lower active gate blocking pattern; and
a lower active gate insulating layer conformally formed on an inner wall of the lower active gate tunnel,
wherein the second gate conductive layer is formed on the lower active gate insulating layer.

9. The semiconductor device of claim 8, wherein a thickness of the lower active gate blocking pattern is greater than a thickness of the lower active gate insulating layer, and is greater than a thickness of the upper active gate insulating layer.

10. The semiconductor device of claim 9, wherein the first gate conductive layer comprises:
an upper active gate barrier pattern conformally formed on the upper active gate insulating layer of the lower portion of the upper active gate trench; and
an upper active gate electrode pattern formed on the upper active gate barrier pattern to fill the lower portion of the upper active gate trench, and
wherein the second gate conductive layer comprises:
a lower active gate barrier pattern conformally formed on the lower active gate insulating layer; and
a lower active gate electrode pattern formed on the lower active gate barrier pattern to fill the lower active gate tunnel.

11. The semiconductor device of claim 10, wherein a top surface of the upper active gate barrier pattern and a top surface of the upper active gate electrode pattern are coplanar.

12. The semiconductor device of claim 11, wherein the lower active gate barrier pattern surrounds a surface of the lower active gate electrode pattern.

13. The semiconductor device of claim 1, further comprising a plurality of intermediate active gate structures between the upper active gate structure and the lower active gate structure.

14. A semiconductor device comprising:
a device isolation region defining an active region in a substrate;
an upper active gate structure formed in the active region, the upper active gate structure including a first gate conductive layer;
a lower active gate structure formed in the active region, the lower active gate structure being formed under the upper active gate structure, vertically spaced apart from the upper active gate structure, and including a second gate conductive layer; and
a field gate structure in the device isolation region, the field gate structure including a field gate conductive layer,
wherein the lower active gate structure includes a blocking insulation layer, a first gate insulating layer on the blocking insulation layer, and the second gate conductive layer on the first gate insulating layer, and the upper active gate structure is formed on the lower active gate structure, vertically spaced apart from the lower active gate structure, and the upper active gate structure includes a second gate insulating layer and the first gate conductive layer on the second gate insulating layer, and
wherein the blocking insulation layer is electrically separated from the second gate conductive layer.

15. The semiconductor device of claim 14, wherein a bottom surface of the blocking insulation layer of the lower active gate structure is lower than a bottom surface of the field gate conductive layer of the field gate structure.

16. The semiconductor device of claim 15, wherein a thickness of the blocking insulation layer is greater than a thickness of the first gate insulating layer and is greater than a thickness of the second gate insulating layer.

17. The semiconductor device of claim 15, wherein a top surface of the field gate conductive layer of the field gate structure is lower than a bottom surface of the first gate conductive layer of the upper active gate structure.

18. The semiconductor device of claim 15, wherein a thickness of the first gate conductive layer is greater than a thickness of the second gate conductive layer.

19. The semiconductor device of claim 15, wherein a channel area is formed between the lower active gate structure and the upper active gate structure, and the first and second gate conductive layers surround the channel area.

* * * * *